(12) United States Patent
Inoke et al.

(10) Patent No.: US 8,078,442 B2
(45) Date of Patent: Dec. 13, 2011

(54) SCREW FASTENING PART ANALYSIS MODEL CREATION METHOD, RECORDING MEDIA, AND APPARATUS

(75) Inventors: Misao Inoke, Kawasaki (JP); Rikako Shinomiya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 598 days.

(21) Appl. No.: 12/099,823

(22) Filed: Apr. 9, 2008

(65) Prior Publication Data

US 2008/0189091 A1    Aug. 7, 2008

Related U.S. Application Data

(63) Continuation of application No. PCT/JP2006/300077, filed on Jan. 6, 2006.

(51) Int. Cl.
  *G06G 7/48* (2006.01)
(52) U.S. Cl. .................................. 703/7; 703/6
(58) Field of Classification Search ............ 703/6–7
  See application file for complete search history.

(56) References Cited

U.S. PATENT DOCUMENTS

| 5,920,491 | A | 7/1999 | Hibbitt et al. |
| 6,904,395 | B1 | 6/2005 | DeJack et al. |
| 7,499,845 | B1 * | 3/2009 | Quincy et al. ............ 703/7 |

FOREIGN PATENT DOCUMENTS

| JP | 9-245072 | 9/1997 |
| JP | 2000-268063 | 9/2000 |
| JP | 2001-265836 | 9/2001 |

OTHER PUBLICATIONS

McCarthy et al., Three-dimensional finite element analysis of single-bolt, single-lap composite bolted joints: part I—model development and validation, Nov. 2004, Elsevier, Composite Structures 71, pp. 140-158.*
Kinney et al., 2001. Three dimensional threaded fastener meshing algorithm. In Proceedings of the Sixth ACM Symposium on Solid Modeling and Applications (Ann Arbor, Michigan, United States). D. C. Anderson, Ed. SMA '01. ACM, New York, NY, 71-77.*
PCT International Search Report mailed Jan. 6, 2006 for International Application No. PCT/JP2006/300077.
European Search Report dated Mar. 31, 2010 and issued in corresponding European Patent Application 06711465.2.

* cited by examiner

*Primary Examiner* — Dwin M Craig
*Assistant Examiner* — Aniss Chad
(74) *Attorney, Agent, or Firm* — Staas & Halsey LLP

(57) ABSTRACT

According to an aspect of an embodiment, a method comprises a screw fastening unit extracting step of extracting a screw fastening unit, in which at least two or more members are fastened by a screw, from a three-dimensional model, a shape changing step of changing each of circular arc surfaces of the screw, a screw through hole, and a screw hole disposed in the screw fastening unit to a polygonal polyhedron approximating the circular arc surface, a mesh creation step of creating an analysis model which is divided into a meshed analysis unit by allocation of polyhedral meshes along each of the edge surfaces of the screw, screw through hole, and screw hole which is changed to polyhedrons, and a contact definition step of setting the friction of a contact unit of the mesh-divided screw and screw hole to be infinite so as to achieve a fixed state.

14 Claims, 26 Drawing Sheets

US 8,078,442 B2

SCREW FASTENING PART ANALYSIS MODEL CREATION METHOD, RECORDING MEDIA, AND APPARATUS

CROSS-REFERENCE TO RELATED APPLICATIONS

This application is a continuation of PCT/JP2006/300077, filed Jan. 6, 2006.

BACKGROUND

1. Field

The present art relates to a screw fastening unit analysis model creation method, recording media, and apparatus of creating an analysis model by subjecting a three-dimensional model of a device having a screw fastening unit to mesh separation and particularly relates to the screw fastening unit analysis model creation method, recording media and apparatus of creating the analysis model in which the meshes of a screw and a screw hole are precisely fit.

2. Description of the Related Art

Recently, in information processing devices such as hard disk drives, along with increased densities of media and improvement of the resistance of the devices to shock, performing examination in advance by analysis of the misalignment caused by temperature variations between members fastened by a screw and analysis of the misalignment between the members caused by shock that takes friction into consideration has become important.

For example, test of cyclically varying the environmental temperature between a normal temperature of 20° C. and a high temperature of 70° C. is sometimes performed as temperature cycling test that takes the usage environment of the devices into consideration; and, when such temperature cycling test is performed, a screw fastening unit in which two members having different thermal expansion conditions with respect to the temperature are fixed has a problem that misalignment between the members is momentarily generated due to the difference in the degree of thermal expansion caused by temperature variation when the screw fastening force is not appropriate, and examination in advance by misalignment analysis is required.

In the misalignment analysis of such members fastened by a screw, a three-dimensional model of a device having the screw-fastened part created by a CAD has to be subjected to mesh separation to create an analysis model which is divided into meshes.

Patent Document 1: Japanese Patent Application Laid-Open Publication No. 2001-265836
Patent Document 2: Japanese Patent Application Laid-Open Publication No. H09-245072

However, in conventional mesh separation, mesh separation of an outer peripheral circular arc surface which serves as a screw outer shape and mesh separation of an inner peripheral circular arc surface which serves as a screw hole is performed by using triangles or trapezoids, and the edges of the screw and the screw holes are circular arc while the edges of the triangles and trapezoids are straight; therefore, even when the accuracy is enhanced by reducing the mesh size, the mesh-separated circular arc edge of the screw outer periphery and circular arc edge of the hole inner periphery become polygonal mesh edges wherein a plurality of meshes are arranged circularly, and the part in which the meshes of the screw and the screw hole are overlapped or a gap is generated in the engaged part of the screw and the screw hole, and there is a problem that the screw cannot be fixed to the screw hole.

FIGS. 24A and 24B are exploded view of a three-dimensional model of a device which is an analysis object. Screw holes 102 are provided at peripheral upper end portions of a base 100, and it has a structure that a cover 104 is placed on the base 100 and fastened and fixed by screws 106.

FIG. 25 shows part of the base 100 of FIGS. 24A and 24B, wherein the screw 106 is fastened with the screw hole 102 via the cover 104 therebetween. When the base 100 in which the screw hole 102 is provided is subjected to mesh separation (mesh generation) by using triangle meshes, FIGS. 26A to 26C are obtained.

FIG. 26A shows the base 100 which has undergone mesh separation, FIG. 26B is an enlarged view of the part of a screw hole 102-1 thereof, and FIG. 26C is a plan view thereof. The edge of the screw hole 102 before it is subjected to mesh separation is circular arc as shown in FIG. 25; and, when mesh separation is performed by using triangular meshes as shown in FIGS. 26A to 26C, the screw hole 102-1 having a polygonal edge is obtained since triangular meshes are generated along the circular arc edge.

In FIGS. 27A to 27C, the meshes are eliminated without changing the edge of the base 100 after it has undergone the mesh separation of FIGS. 26A to 26C, wherein the screw hole 102-1 is provided as a polygonal cylindrical hole through the mesh separation, and there are projections of the edge in the middle thereof.

FIGS. 28A and 28B show a screw 106-1 which has undergone mesh separation by using triangular meshes; and, since the triangular meshes are generated along a cylindrical surface, it has an uneven prismatic shape having polygonal edges, and the edges are projected or recessed with respect to plane surfaces.

FIGS. 29A and 29B show the screw 106-1 after it has undergone the mesh separation of FIGS. 28A and 28B with the edges thereof unchanged and the meshes eliminated, and it has a prismatic shape having irregularities on the edge surfaces due to the mesh separation. FIG. 29C shows a transparent state.

In order to solve the problem that an overlapped part or a gap is generated in the engaged part of the screw and the screw hole due to the mesh separation of the screw fastening unit and accurate engagement cannot be performed, with respect to a screw fastening unit in which the cover 104 is fastened to the screw hole 102 of the base 100 by the screw 106 of FIG. 30A, the screw 106 is omitted as shown in FIG. 30B, the lower surface of the base 100 having the screw hole 102 is fixed, a contact unit 108 of the upper surface of the cover 104 and the screw 106 is pressed down by screw axial force 110, and the misalignment between the members with respect to temperature variation is analyzed in this state.

However, screw fastening units of the device required to be subjected to misalignment analysis is plural, and, moreover, there is a level difference in some cases due to different heights H1 and H2 of disposed positions 112-1 and 112-2 of the screw holes 102-1 and 102-2 of the base 100 as shown in FIG. 31. When there is a level difference between screw fastening units, the displacement in the base 100 side with respect to thermal expansion and thermal contraction is different depending on the level difference, the thermal expansion and thermal contraction caused by the level difference is not taken into consideration by the fixing method of merely pressing down the contact units 108-1 and 108-2 of the upper surface of the cover 104 with the screws by screw axial force 110-1 and 110-2, and strict misalignment analysis is not performed.

SUMMARY

According to an aspect of an embodiment, a method comprises a screw fastening unit extracting step of extracting a screw fastening unit, in which at least two or more members are fastened by a screw, from a three-dimensional model, a shape changing step of changing each of circular arc surfaces of the screw, a screw through hole, and a screw hole disposed in the screw fastening unit to a polygonal polyhedron approximating the circular arc surface, a mesh creation step of creating an analysis model which is divided into a meshed analysis unit by allocation of polyhedral meshes along each of the edge surfaces of the screw, screw through hole, and screw hole which is changed to polyhedrons, and a contact definition step of setting the friction of a contact unit of the mesh-divided screw and screw hole to be infinite so as to achieve a fixed state.

DETAILED DESCRIPTION OF THE EMBODIMENTS

Figure 1:
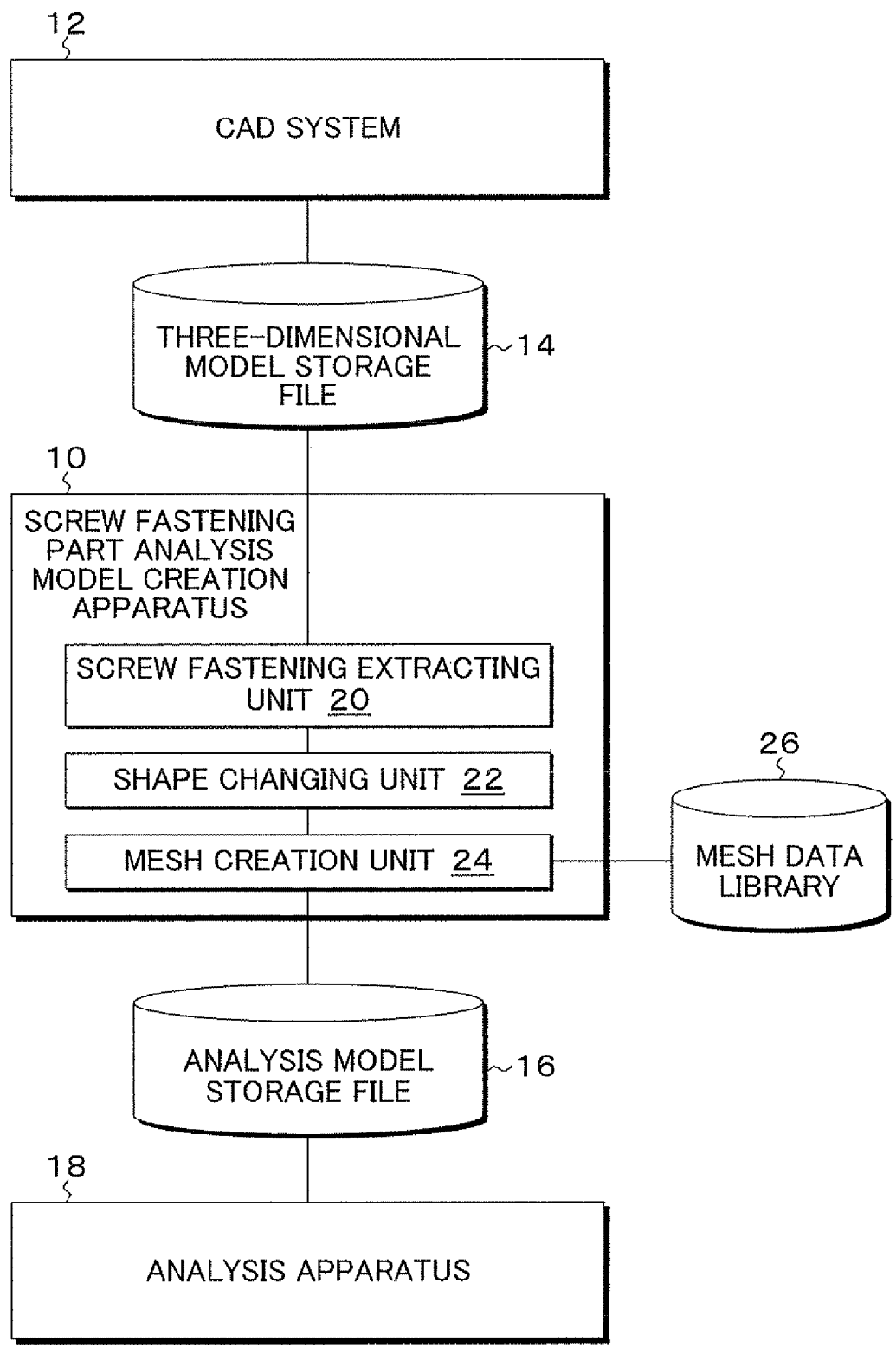
FIG. 1 is a block diagram of a functional configuration of a screw fastening unit analysis model creation apparatus according to the present art.

FIG. 1 is a block diagram of a functional configuration of a screw fastening unit analysis model creation apparatus according to the present art. In FIG. 1, a three-dimensional model storage file 14 is provided with respect to the screw fastening unit analysis model creation apparatus 10 according to the present art, and three dimensional models of analysis object devices created by designing operations using a CAD system 12 are stored in the three-dimensional model storage file 14.

An analysis model storage file 16 is provided in the output side of the screw fastening unit analysis model creation apparatus 10 and stores created analysis models for screw fastening unit analysis; and, by using them, an analysis apparatus 18 performs analysis of misalignment caused by temperature variation between members fastened by a screw and analysis of misalignment between the members caused by shock, and the like, which takes friction into consideration.

In the screw fastening unit analysis model creation apparatus 10, a screw fastening unit extracting unit 20, a shape changing unit 22, and a mesh creation unit 24 are provided, and a mesh data library 26 is connected to the shape changing unit 22.

The screw fastening unit extracting unit 20 reads a three-dimensional model in which two or more members such as a base and a cover serving as processing objects are fastened by a screw from a three-dimensional model storage file 14 and, in the state in which the three-dimensional model is displayed in a display, automatically extracts a screw extracting unit in response to extracting process specification of the screw fastening unit based on a user operation.

The shape changing unit 22 uses, as an object, one or a plurality of screw fastening unit of a three-dimensional model extracted by the screw fastening unit extracting unit 20 and changes the circular arc surface of each of a screw disposed to the screw fastening unit, a screw through hole of a cover, and a screw hole of a base to the shape of a polygonal polyhedron approximating the circular arc surface. As the polyhedral shape changed to by the shape changing unit 22, changing to a hexagonal or octagonal polyhedron is desirable.

Other than the hexagonal shape or octagonal shape, for example, a quadrangular shape, a triangular shape, a decagonal shape, or a dodecagonal shape can be used; however, when the number of lines thereof is small, they are inappropriate since difference from a cylindrical body is too large.

On the other hand, when the number of lines is increased, each of the straight line segments constituting the polygonal shape is shortened, the mesh size of the mesh separation which is to be subsequently performed becomes unnecessarily small, and the processing load is increased; thus, the merit of increasing the number of lines is small.

Therefore, as the present embodiment, changing it to a hexagonal or octagonal polygon is desirable.

As a matter of course, changing to a polygon other than these in accordance with needs is not prohibited.

In addition, in the shape changing unit 22, prior to the shape change, whether the shape attributes of a screw, a screw through hole, and a screw hole in the three-dimensional model serving as a processing object are matched is examined, the shape attributes are caused to be matched if they are unmatched, and then the shape change is performed. As the examination of the shape attributes of the screw, the screw through hole, and the screw hole, (1) examination whether the outer diameter of the screw and the hole diameter of the screw hole are matched
(2) examination whether the origin points and end points of edge shapes of the hole of the screw hole, the screw through hole, and the screw hole are matched is performed.

The mesh creation unit 24 subjects each of the screw outer diameter shape and the hole shapes of the screw through hole and the screw hole having the hexagonal or octagonal polygons changed by the shape changing unit 22 to mesh separation (mesh creation) of dividing it into meshed analysis units by allocation of meshes using triangular meshes or trapezoidal meshes.

Both the triangular meshes and trapezoidal meshes used by the mesh creation unit 24 are three dimensional. In the case of the triangular mesh, it is composed of a tetrahedron in which each face has a triangular shape; and, regarding the trapezoidal mesh is composed of a hexahedron in which each side is composed of a trapezoid.

In the mesh creation using such triangular meshes or trapezoidal meshes, the edge surfaces are flat since the changed surface of the screw, the screw through hole, and the screw hole is changed into hexagonal or octagonal polyhedrons by the shape changing unit 22. Therefore, the mesh creation is performed by allocating the triangular meshes or trapezoidal meshes so that they are arranged along the flat edge surfaces; therefore, the meshes are not projected or recessed over the outer diameter shape of the screw having the edge surfaces composed of the tetragonal or octagonal polyhedrons.

Similarly, also about the hole shapes of the screw through hole and the screw hole, when triangular meshes or trapezoidal meshes are allocated and arranged with respect to flat edge inner surfaces composed of hexagonal or octagonal polyhedrons, meshes properly aligned in the edge surfaces of the screw outer diameter and the hole inner surfaces of the screw through hole and the screw hole can be created without causing the edges to project over the edge inner surface or the edge to be recessed.

Moreover, the mesh creation unit 24 prepares, in advance, mesh data having a unit size composed of a plurality of mesh aggregations as the meshes to be allocated to each of the screw outer diameter shape and the hole shapes of the screw through hole and the screw hole after the shape change and saves it in the mesh data library 26. Then, when it is to be actually applied to a model which has undergone the shape change to perform mesh creation, the mesh data of the mesh data library 26 having the unit size is subjected to scale change and allocate so that it is matched with the size of the object model, thereby automatically performing the mesh creation in the screw unit, screw through hole unit, and screw hole unit.

Particularly, a screw can be used as an independent single part model; therefore, when mesh data composed of a mesh aggregation constituting the screw having a unit size is created in advance and a library saving it is created after shape changed in the mesh data library 26, mesh creation of the screw can be executed precisely at a high speed by applying the mesh data by changing the scale matched to the dimensional size thereof.

As a matter of course, also about a screw through hole or a screw hole, when a predetermined region including the hole part is cut off as a single part model and saved in the mesh data library 26 in advance as mesh data which is composed of a mesh aggregation and has a unit size, mesh creation can be performed in actual application by changing the scale of the mesh data of the hole shape so that it is matched with the dimensions of the screw through hole and screw hole.

Herein, in creation of an analysis model in the screw fastening unit analysis model creation apparatus 10 of the present art, after shape change by the shape changing unit 22 and mesh creation by the mesh creation unit 24 is performed in an exploded state of three-dimensional models of each of the screw, a cover having screw through holes, and a base in which screw holes are provided, assembling of aligning the cover with the base and inserting screws may be performed, and an analysis model may be created; alternatively, shape change and mesh creation can be performed from the beginning in an engaged state which is a fastened state of the cover with respect to the base by the screws.

When shape change and mesh creation is performed in the exploded state of the screws, cover, and base, insertion is performed with a friction coefficient between the contact surfaces of the screws and the contact surfaces of the screw holes set to zero upon screw insertion, and they are fastened when the friction coefficient after insertion is caused to be infinite.

On the other hand, when an analysis model is created for a model in an assembled state by shape change and mesh creation, they can be fixed when the friction between the screws and screw holes is caused to be infinite after the creation. In both cases, the screw axial force that fixes the base and fixes the cover by the screws is released at the point when the friction between the screws and screw holes is caused to be infinite.

Figure 2:
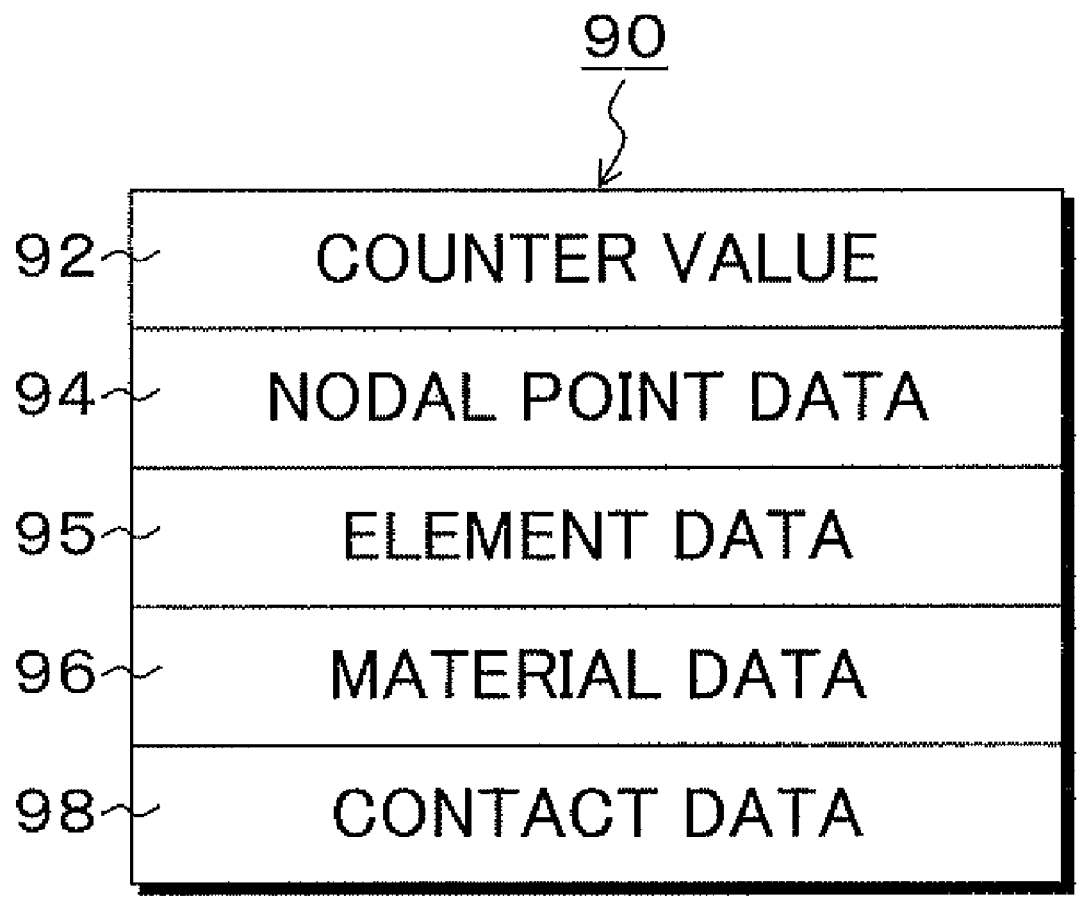
FIG. 2 is an explanatory drawing of mesh data stored in the library file of FIG. 1.

FIG. 2 is an explanatory drawing of mesh data stored in the mesh data library 26 of FIG. 1, and it is composed of a counter value 92, nodal point data 94, element data 95, material data 96, and contact data 98 of a screw counter for managing screw fastening units serving as processing objects.

The nodal point data 94 stores, for example, the total number of connecting vertices of triangular meshes or quadrangular meshes that creates a shape-changed screw. The element data 95 is, for example, the number of meshes required for creating the shape-changed screw. The material data 96 is materials of the screw. Furthermore, the contact data 98 is the data defining the meshes in contact with a screw hole if it is a screw.

Such mesh data 90 is created in advance for each of the screws, screw through holes, and screw holes as unit sizes; and, in actual mesh creation of the screws, screw through holes, and screws, the magnification is changed to the scale matching the length, width, and height so as to automatically perform mesh creation.

Figure 3:
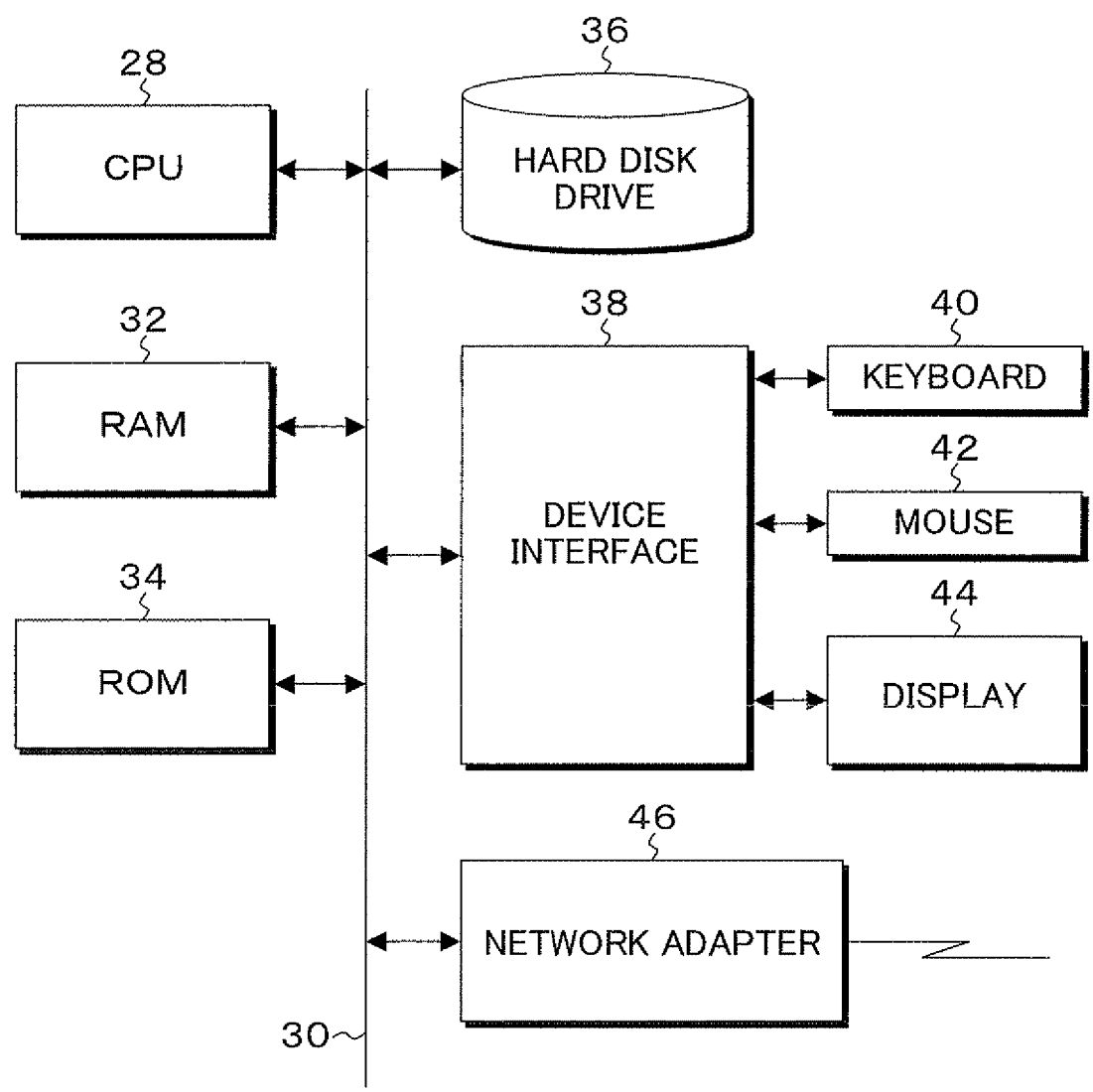
FIG. 3 is a block diagram of a hardware environment of a computer that realizes the apparatus of FIG. 1.

FIG. 3 is a block diagram of a hardware environment of a computer which realizes the screw fastening unit analysis model creation apparatus 10 of FIG. 1.

In the computer of FIG. 3, with respect to a bus 30 of a CPU 28, a RAM 32, a ROM 34, a hard disk drive 36, a device interface 38 connecting a keyboard 40, a mouse 42, and a display 44, and a network adapter 46 for establishing communication connection with outside such as the Internet or a LAN are provided.

The hard disk drive 36 stores an application program that executes a screw fastening unit analysis model creation process of the present art; and, in the state in which the computer is started up and an OS is deployed, the application program for screw fastening analysis model creation according to the present art is invoked from the hard disk drive 36, deployed on the RAM 32, and executed by the CPU 28.

The hardware environment of the computer same as that of FIG. 3 is used also for the CAD system 12 and the analysis apparatus 18 of FIG. 1. Since it is the same computer as hardware, when an application program for a CAD system and an application program for the analysis apparatus 18 are stored in the hard disk drive 36, read to the RAM 32, and executed by the CPU 28, designing of three-dimensional models by the CAD system 12 required for the screw fastening unit analysis model creation of the present art and misalignment analysis between the members by the analysis apparatus 18 using the created analysis model can be performed.

Figure 4A:
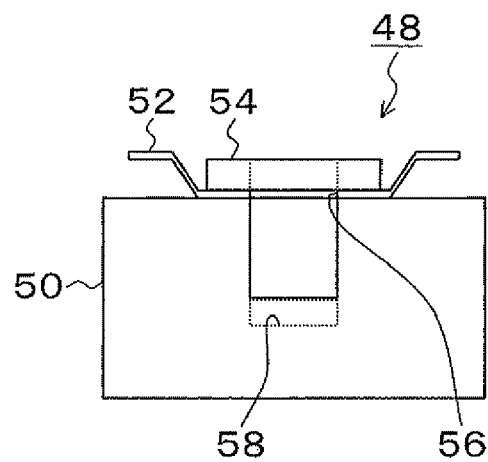
FIGS. 4A and 4B are explanatory drawings of a shape changing process according to the present art of changing a screw fastening unit circular arcs of a three-dimensional model to an octagonal shape.
Figure 4B:
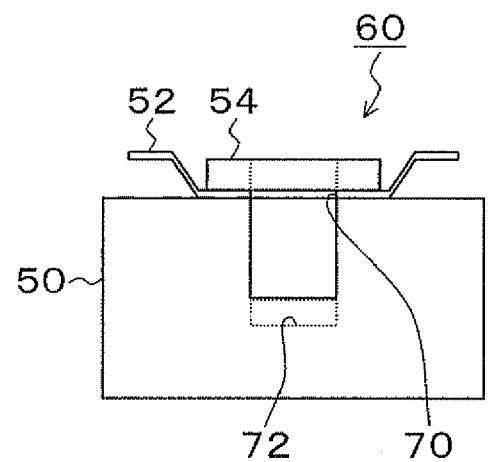

FIGS. 4A and 4B are explanatory drawings of a shape changing process according to the present art that changes a circle in a screw fastening unit of a three-dimensional model into an octagonal shape.

FIG. 4A focuses on a screw fastening unit of a three-dimensional model 48 serving as a processing object; wherein a screw hole 58 is provided in a base 50, a cover 52 having a screw through hole 56 is disposed above the base 50, and a screw 54 is inserted in and engaged with the screw hole 58 via the screw through hole 56.

With respect to the screw fastening unit of the three-dimensional model 48, the shape changing process is executed by the shape changing unit 22 of FIG. 1, thereby generating a shape-changed model 60 shown in FIG. 4B. In the shape-changed model 60, the screw hole 58 of the base 50 is an octagonal screw hole 72. The shapes of a head unit and a shaft unit, which serves as a screw main body, of the screw 54 are changed into octagonal shapes, and the screw through hole 56 of the cover 52 is also changed to an octagonal screw through hole 70.

Figure 5A:
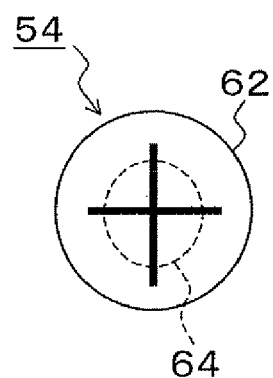
FIGS. 5A and 5B are explanatory drawings focusing on and showing the screw of FIGS. 4A and 4B.
Figure 5B:
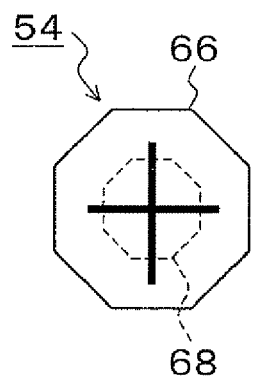

FIGS. 5A and 5B focuses on the screw 54 of FIGS. 4A and 4B and shows it before shape change and after change. FIG. 5A shows it before shape change, and the screw 54 is composed of a cylindrical head unit 62 and a shaft unit 64. When shape change is performed for this screw 54, the head unit 62 is changed to an octagonal head unit 66 as shown in FIG. 5B, and the shaft unit 64 is changed to an octagonal shaft unit 68.

Figure 6A:
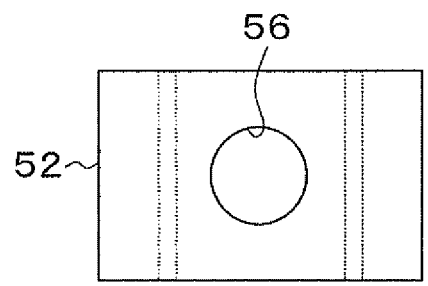
FIGS. 6A and 6B are explanatory drawings focusing on and showing the cover of FIGS. 4A and 4B.
Figure 6B:
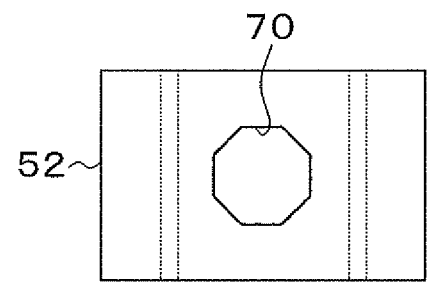

FIGS. 6A and 6B are plan vies of the cover 52 of FIGS. 4A and 4B before change and after change.

The round screw through hole 56 is formed in the cover 52 of FIG. 6A before change, and this is changed to an octagonal screw through hole 70 as shown in FIG. 6B by shape change.

Figure 7A:
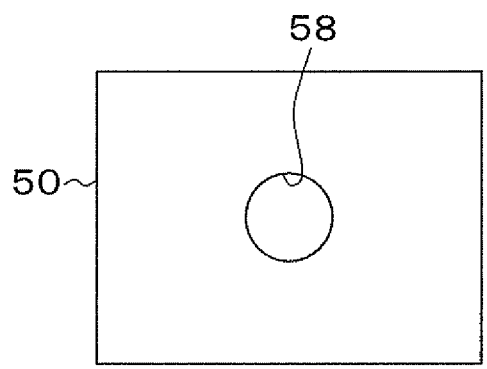
FIGS. 7A and 7B are explanatory drawings focusing on and showing the base of FIGS. 4A and 4B.
Figure 7B:
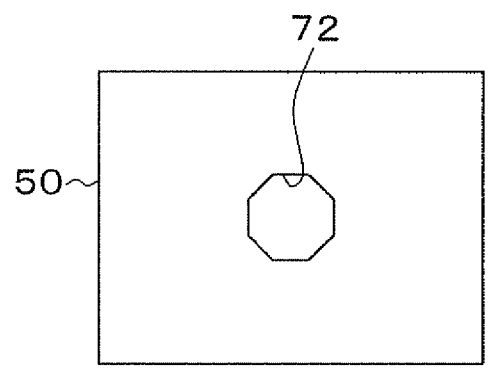

FIGS. 7A and 7B show the base 50 of FIGS. 4A and 4B before change and after change. The screw hole 58 of the base 50 of FIG. 7A before change is a cylindrical hole; however, the screw hole 58 of FIG. 7B after shape change is changed to an octagonal screw hole 72.

Figure 8A:
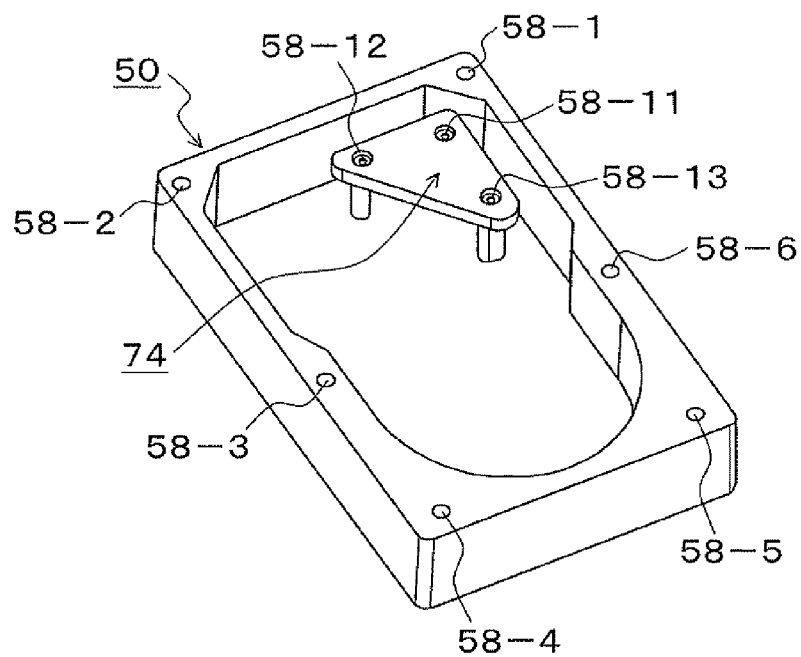
FIGS. 8A to 8C are explanatory drawings of a three-dimensional model of a device serving as a processing object of the present art wherein a base and a cover are fastened by screws.
Figure 8B:
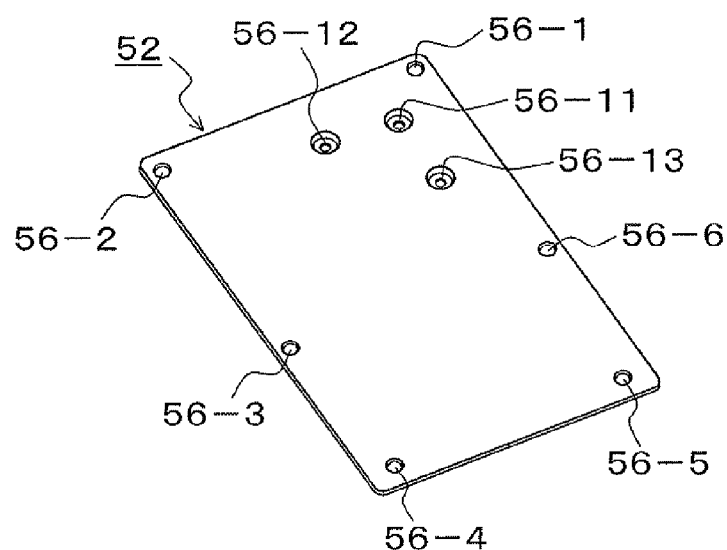
Figure 8C:
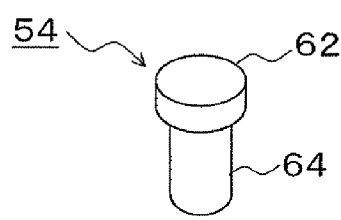

FIGS. 8A to 8C are explanatory drawings of a three-dimensional model of a device serving as a processing object of the present art in which a cover is fastened to a base by screws for example, a hard disk drive. FIG. 8A shows a three-dimensional model of the base 50, wherein screw holes 58-1 to 58-6 are provided at six locations of peripheral upper end portions of the base 50 which is open in the upper side. In addition, a yoke 74 is disposed in the base 50, and screw holes 58-11 to 58-13 are provided at three locations of an upper part of the yoke 74.

FIG. 8B shows the cover 52 attached to the base 50, wherein screw through holes 56-1 to 56-6 are formed corresponding to the screw holes 58-1 to 58-6 in the base 50 side, and screw through holes 56-11 to 56-13 are formed corresponding to the screw holes 58-11 to 58-13 of the yoke 74. Furthermore, FIG. 8C shows the screw 54 used in fastening of the base 50 and the cover 52, and it is composed of the head unit 62 and the threaded shaft unit 64.

Figure 9A:
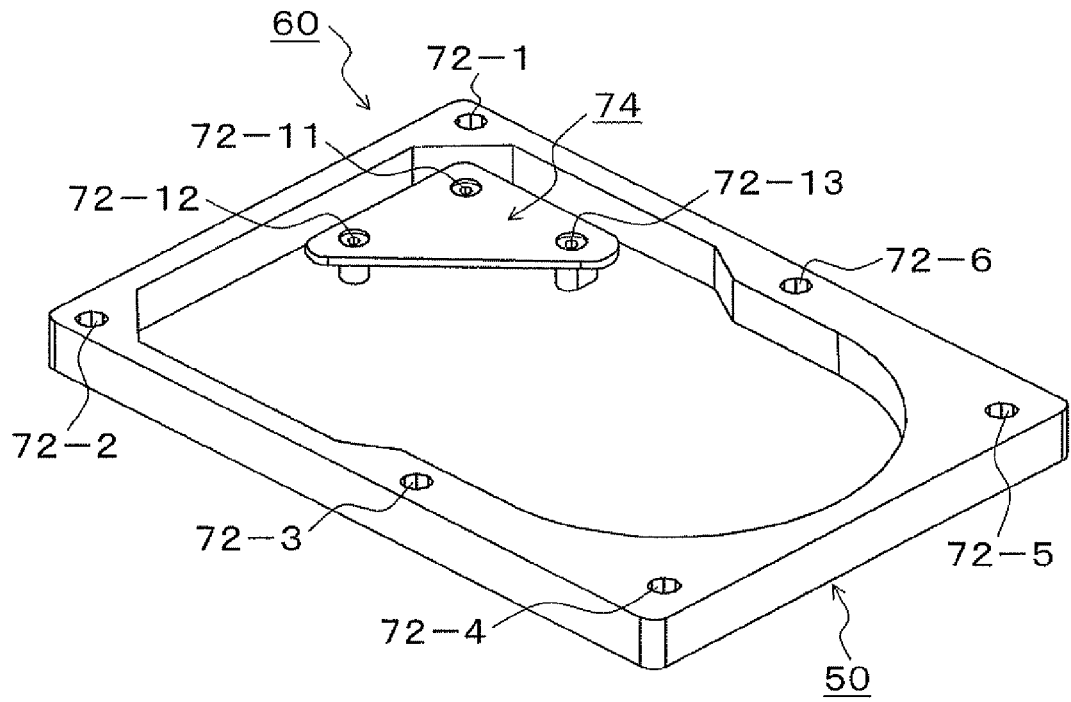
FIGS. 9A and 9B are explanatory drawings of a shape-changed model obtained by subjecting the base of FIGS. 8A to 8C to shape change.
Figure 9B:
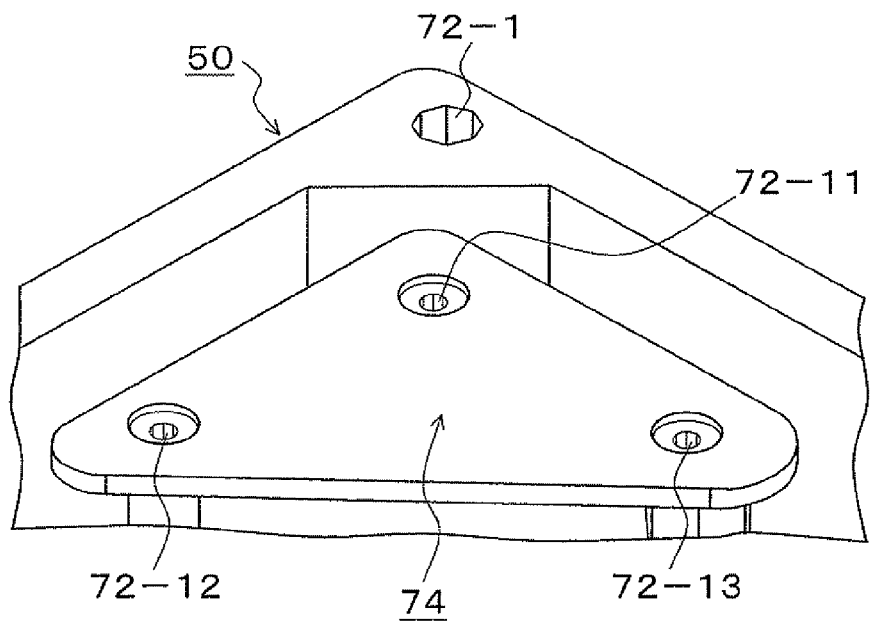

FIGS. 9A and 9B are explanatory drawings of a shape-changed model which is the base 50 of FIGS. 7A and 7B undergone shape change. In the shape-changed model of the base 50 of FIG. 9A, the screw holes at six locations formed in the peripheral upper end of the base 50 are shape-changed to octagonal screw holes 72-1 to 72-6, and the three screw holes of the yoke 74 are also shape-changed to octagonal screw holes 72-11 to 72-13.

FIG. 9B shows the part of the yoke 74 in an enlarged manner, wherein the octagonal screw hole 72-1 is formed in the base 50, and the octagonal screw holes 72-11 to 72-13 are formed in the yoke 74.

Figure 10A:
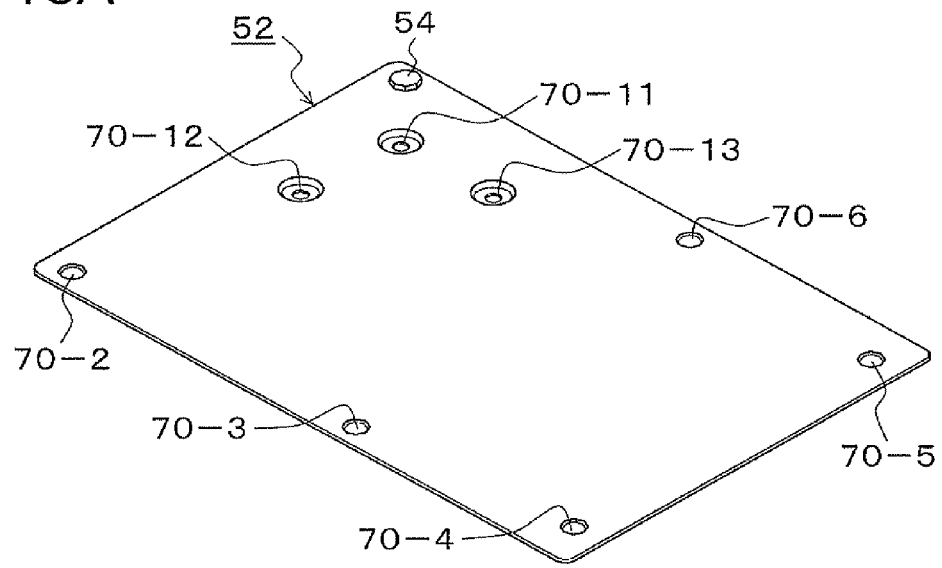
FIGS. 10A to 10C are explanatory drawings of a shape-changed model obtained by subjecting the cover and screw of FIGS. 8A to 8C to shape change.
Figure 10B:
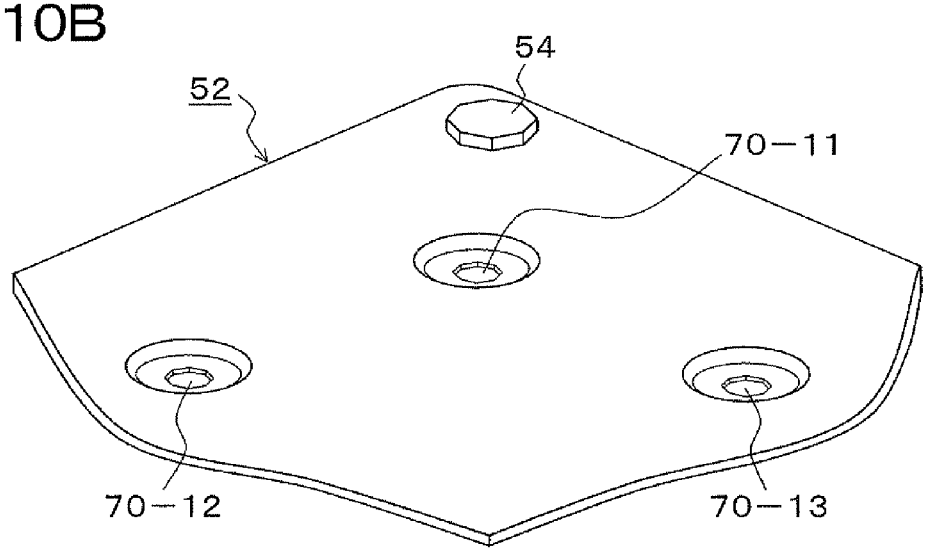
Figure 10C:
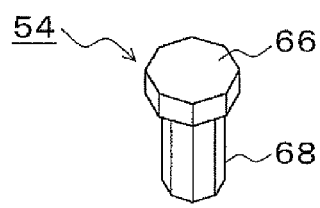

FIGS. 10A to 10C are explanatory drawings of shape-changed models of the cover 52 and the screw 54 of FIGS. 8A to 8C which have undergone shape change.

FIG. 10A shows the shape-changed model of the cover 52; wherein the six screw through holes provided at peripheral six locations have undergone shape change to octagonal screw through holes 70-1 to 70-6, and the shape-changed screw 54 is attached to the octagonal screw hole 70-1 which is not shown among these. In addition, the three screw holes corresponding to the yoke 74 have also undergone shape change to octagonal screw through holes 70-11 to 70-13.

FIG. 10B enlarges the attached part of the screw 54 of the cover 52 of FIG. 10A, wherein it can be seen that the three octagonal screw through holes 70-11 to 70-13 for the yoke have octagonal through hole shapes. Furthermore, FIG. 10C shows the screw 54 which has undergone shape change, and it is composed of the octagonal head unit 66 and the octagonal shaft unit 68.

Figure 11:
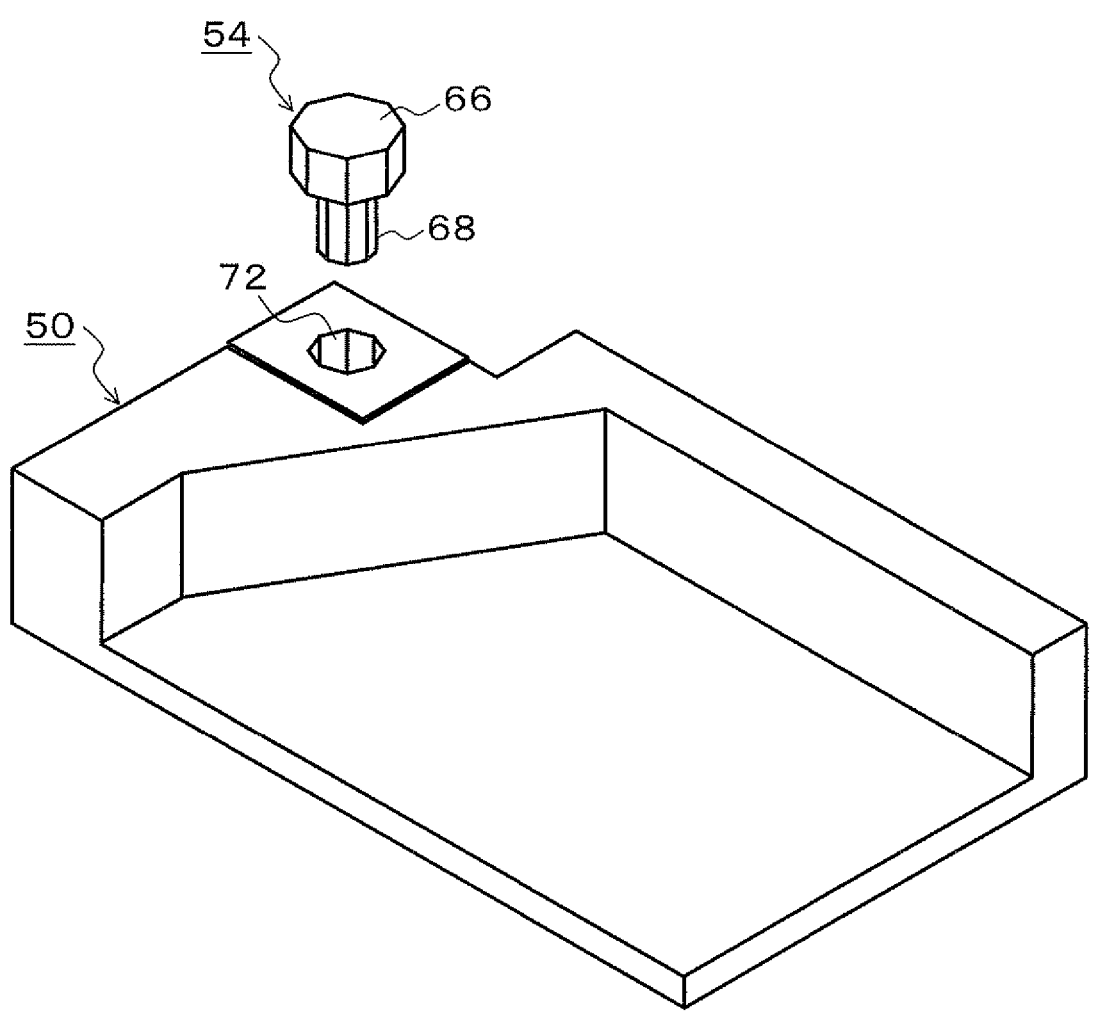
FIG. 11 is an explanatory drawing of a part of the shape-changed model serving as an object of mesh creation.

FIG. 11 is an explanatory drawing focusing on a part of the shape-changed model which serves as an object of mesh creation according to the present art. In FIG. 11, a screw hole provided at a corner unit of the base 50 has undergone shape change to the octagonal screw hole 72, the screw 54 is engaged with this via a screw through hole of a cover (not shown), and the screw 54 is composed of the octagonal head unit 66 and the octagonal shaft unit 68 due to the shape change.

Figure 12A:
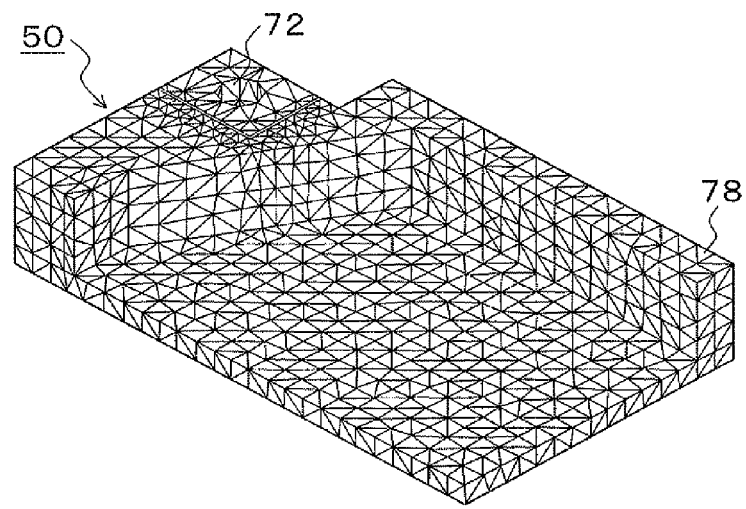
FIGS. 12A to 12C are explanatory drawings of an analysis model which has undergone mesh creation by using triangular meshes with respect to the shape-changed model of the base of FIG. 11.
Figure 12B:
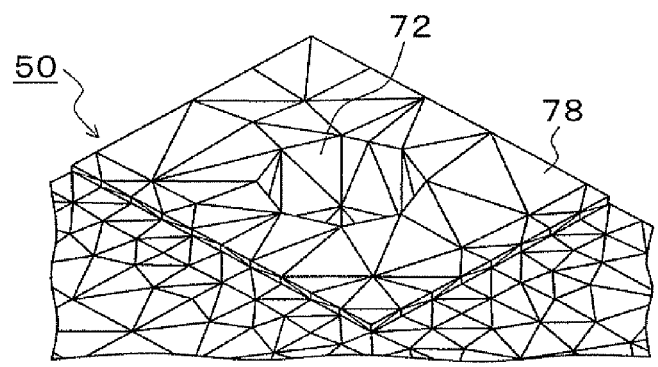
Figure 12C:
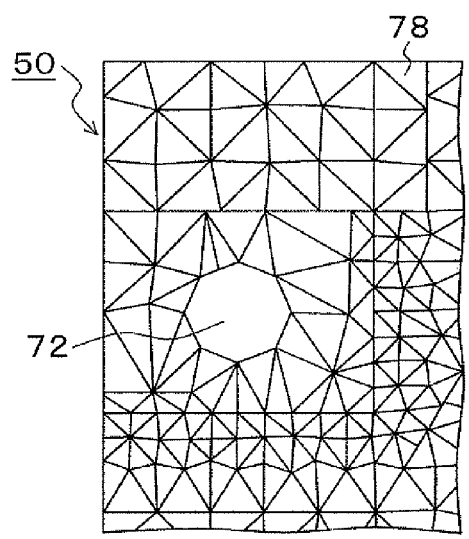

FIGS. 12A to 12C are explanatory drawings of an analysis model which has undergone mesh creation by using triangular meshes with respect to the shape-changed model of the base of FIG. 11. FIG. 12A shows the base 50 in which mesh creation has been performed by using triangular meshes 78, FIG. 12B shows the mesh-created part of the octagonal screw hole 72 of an upper end corner unit of the base 50 in an enlarged manner, and FIG. 12C is a plan view thereof.

In the mesh creation by allocation of the triangular meshes 78 with respect to the octagonal screw hole 72, the inner peripheral edge surface of the octagonal screw hole 72 has an edge shape in which straight line segments constituting an octagonal shape are connected when viewed in a plan view, and each edge line segment is a straight line; therefore, the triangular meshes can be allocated so that they are completely matched with the edge surface along with the edge line segments.

Therefore, in the octagonal screw hole 72 which has undergone mesh creation, irregularities, for example, the triangular meshes that are projected from the inner peripheral edge surface of the octagonal screw hole 72 or recessed toward inside from the mesh surface, are not generated, and precise mesh creation along the edge surfaces of the octagonal screw hole 72 can be realized.

Figure 13A:
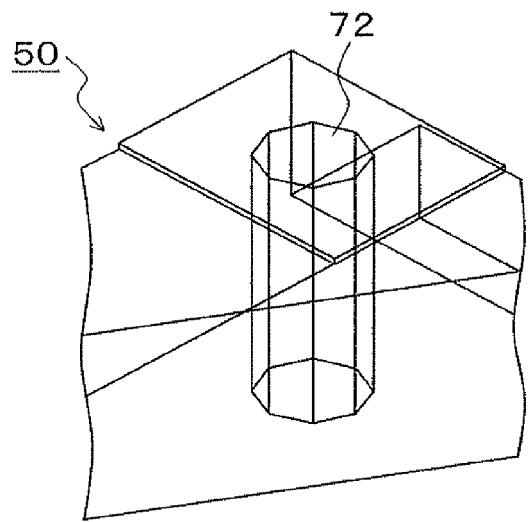
FIGS. 13A to 13C are explanatory drawings showing edge shapes with the meshes eliminated from the base analysis model of FIGS. 12A to 12C.
Figure 13B:
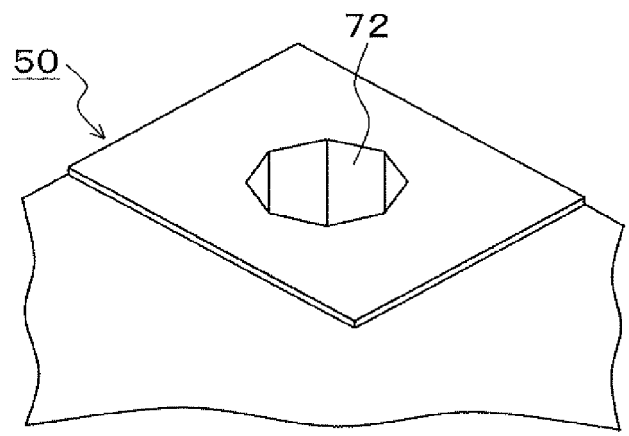
Figure 13C:
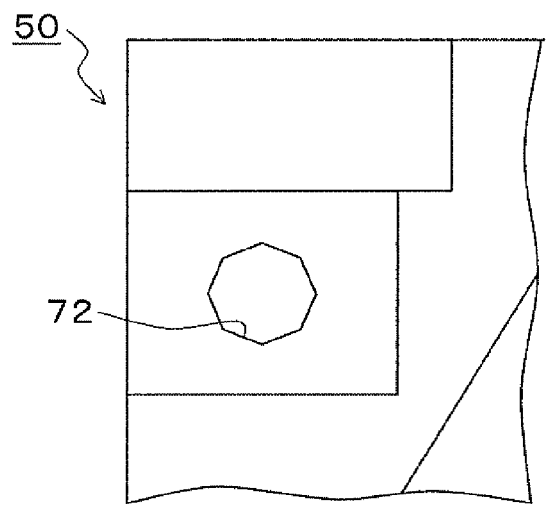

FIGS. 13A to 13C are explanatory drawings in which the meshes shown in the base analysis model of FIGS. 12A to 12C are eliminated, and merely the edge shapes are shown. When the meshes are eliminated, and merely the edge shapes are caused to remain in this manner about the generated meshes, the shape formed by the edges of the created meshes that is completely the same and matched with that of the mesh creation can be formed as the octagonal screw hole 72 of the base 50.

Figure 14A:
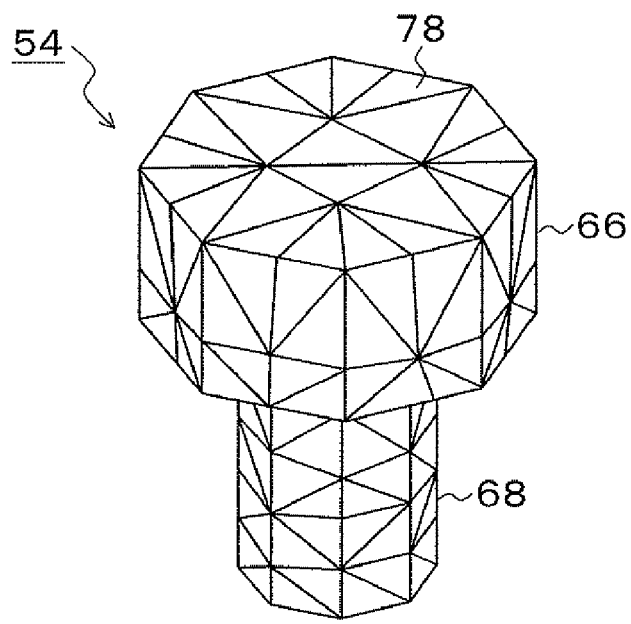
FIGS. 14A and 14B are explanatory drawings of an analysis model which has undergone mesh creation by using triangular meshes with respect to the shape-changed model of the screw of FIG. 11.
Figure 14B:
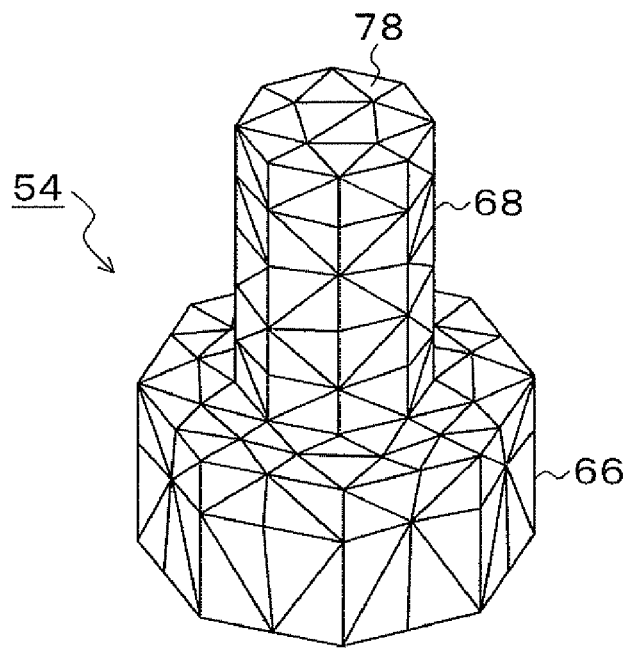

FIGS. 14A and 14B are explanatory drawings of an analysis model which has undergone mesh creation by using triangular meshes with respect to the shape-changed model of the screw 54 of FIG. 11. FIG. 14A is an explanatory drawing of the screw 54, which has undergone mesh creation, viewed from the octagonal head unit 78 side, and FIG. 14B is an explanatory drawing viewed, reversely, from the octagonal shaft unit 68 side wherein the screw 54 is replaced upside down.

Also about the screw 54 which has undergone shape change, the octagonal head unit 66 and the octagonal shaft unit 68 have flat edge surfaces as octagonal polyhedrons; therefore, when triangular meshes are arranged along the edge surfaces, mesh creation along the octagonal head unit 66 and the octagonal shaft unit 68 can be precisely realized without causing part of the meshes to be projected or recessed from the edge surfaces.

Figure 15A:
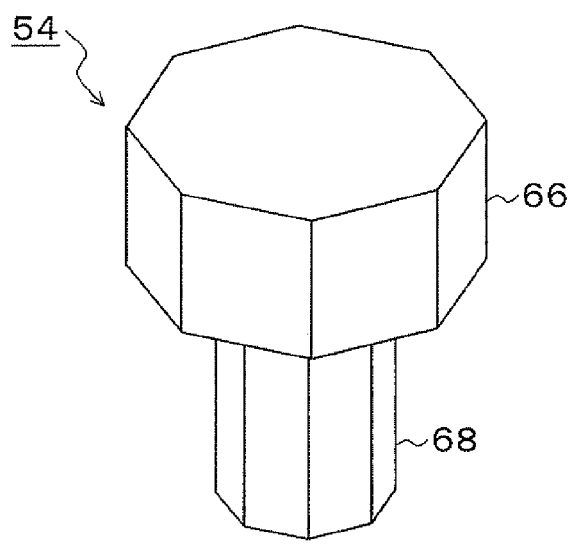
FIGS. 15A to 15C are explanatory drawings showing edge shapes with the meshes eliminated from the screw analysis model of FIGS. 12A to 12C.
Figure 15B:
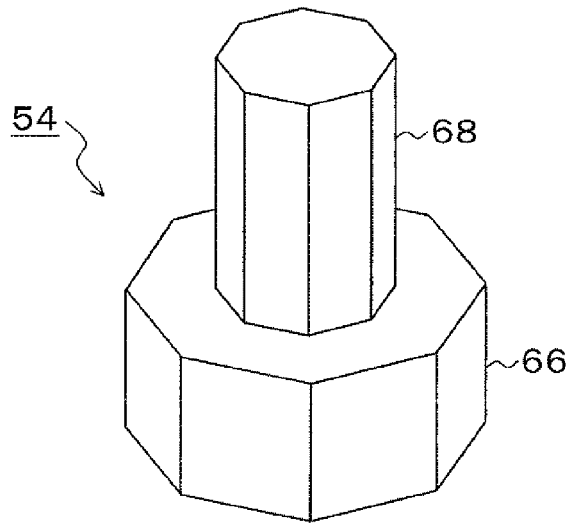

FIGS. 15A and 15B show merely the edge shapes with the meshes eliminated from the screw 54 of FIGS. 14A and 14B, and the edge shape after the meshes are eliminated has the completely same shape as the shape-changed model of the screw 54 which is obtained by the shape change before mesh creation.

Figure 15C:
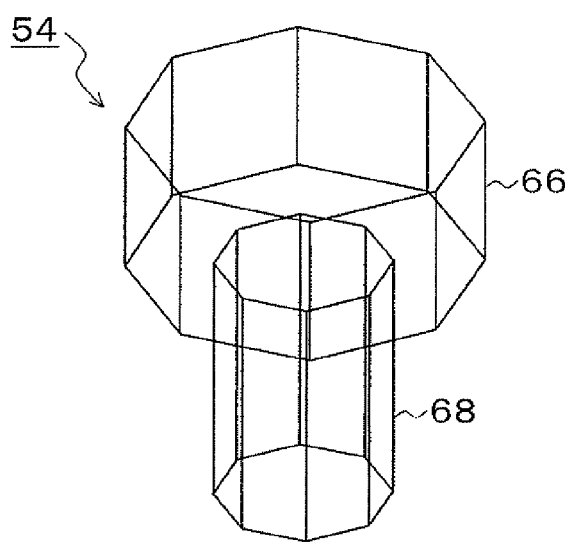

Note that FIG. 15C is a transparent view of the state in which the meshes are eliminated.

Figure 16A:
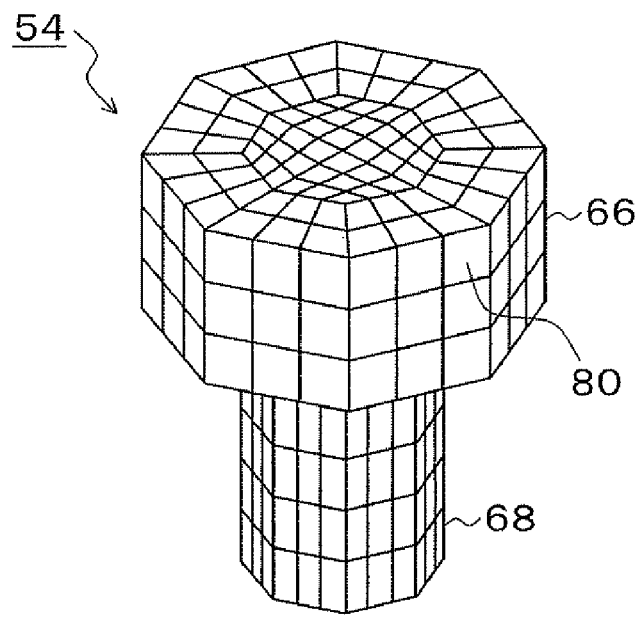
FIGS. 16A and 16B are explanatory drawings of an analysis model which has undergone mesh creation by using trapezoidal meshes with respect to the shape-changed model of the screw of FIG. 11.
Figure 16B:
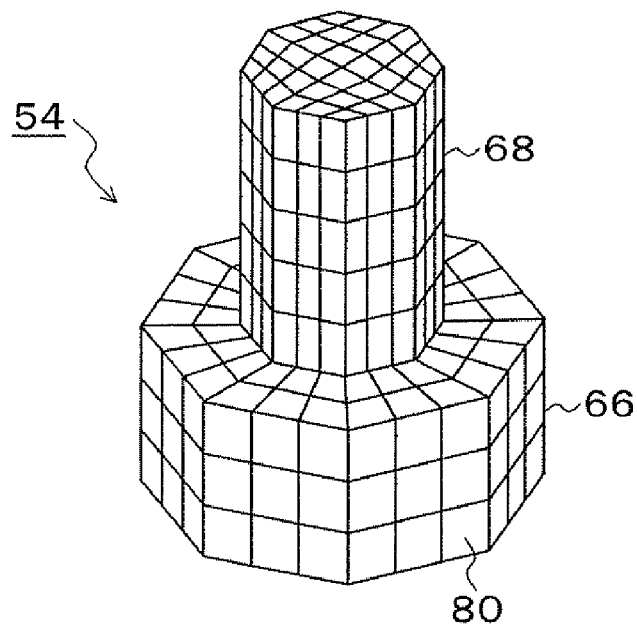

FIGS. 16A and 16B are explanatory drawings of an analysis model which has undergone mesh creation by using trapezoidal meshes with respect to the shape-changed model of the screw of FIG. 11. FIG. 16A is a view of the screw 54 from the octagonal head unit 66 side, and FIG. 16B is a view thereof from the octagonal shaft unit 68 side wherein it is reversed upside down. In the screw 54 of FIGS. 16A and 16B, trapezoidal meshes 80 which are hexahedrons are allocated to the inside along each of the octagonal edge surfaces of the octagonal head unit 66 and each of the edge surfaces of the octagonal shaft unit 68, thereby creating meshes.

Figure 17A:
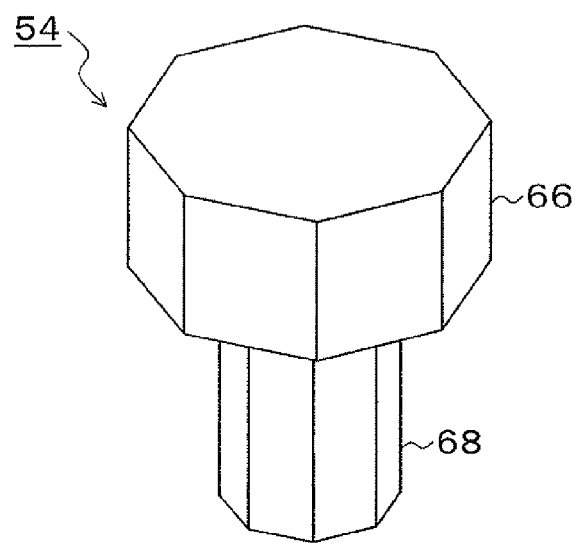
FIGS. 17A to 17C are explanatory drawings showing edge shapes with the meshes eliminated from the screw analysis model of FIGS. 16A and 16B.
Figure 17B:
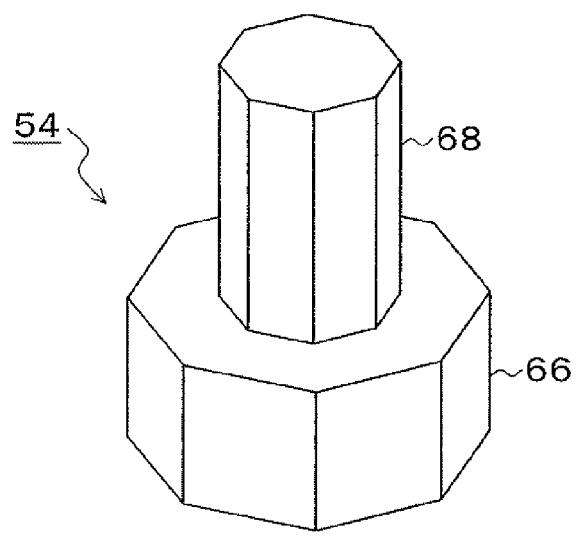

FIGS. 17A and 17B are explanatory drawings showing the analysis model of the screw 54 using the trapezoidal meshes 80 of FIGS. 16A and 16B merely by the edge shapes wherein the meshes are eliminated.

Figure 17C:
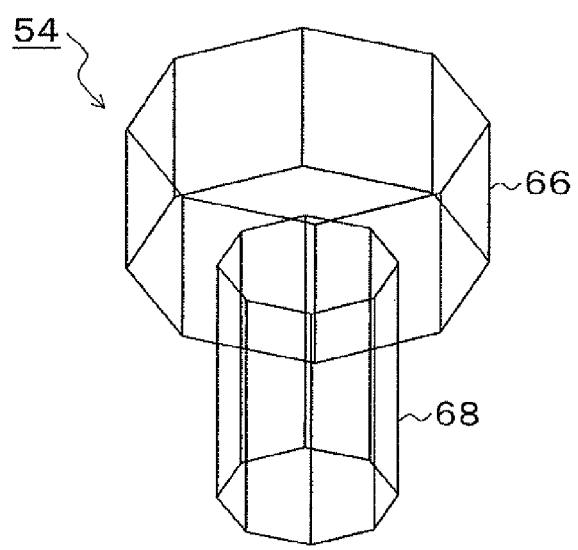

Also in this case, the edge shapes that remains after eliminating the meshes have the outer diameter shape matched with the shape-changed model before mesh creation, and it can be understood that projection or recess is not generated in the screw 54 by the mesh creation. Note that FIG. 17C is a transparent view of the state in which the meshes are eliminated.

Herein, in the mesh data 90 created as a library having the data structure shown in FIG. 2, the mesh data is created for the screw 54 which has undergone mesh creation by using the triangular meshes 78 shown in FIGS. 14A and 14B or the screw 54 which has undergone mesh creation by using the trapezoidal meshes 80 shown in FIGS. 16A and 16B.

More specifically, with respect to the screw 54 of FIGS. 14A and 14B or FIGS. 16A and 16B which has undergone mesh creation, each mesh is normalized to a unit size, the counter value 92 given by a processing counter extracted in the order upon mesh generation is used as an index, the number of connecting vertices connecting the edge parts of the triangular meshes or trapezoidal meshes forming the screw 54 is stored as the nodal point data 94, the number of the meshes forming the screw 54 is stored as the element data 95, the material of the screw is stored as the material data 96, and the contact data 98 in which the definition information of the contact units of the meshes of the screw 54 in contact with the screw hole is set is created.

The library of such mesh data 90 is necessary for the screw 54 of FIGS. 14A and 14B or FIGS. 16A and 16B serving as a single model. On the other hand, about the octagonal screw hole 72 of the base 50 shown in FIGS. 12A to 12C, when, for example, a rectangular hexahedron region including the octagonal screw hole 72 is extracted, and a library of this region is created as the mesh data, mesh creation can be similarly realized by changing the scale matched to the scale of the octagonal screw hole 72 which is actually applied. Regarding this point, a library as a mesh aggregation according to a unit size can be similarly created also for the screw through hole of the cover 52.

Figure 18A:
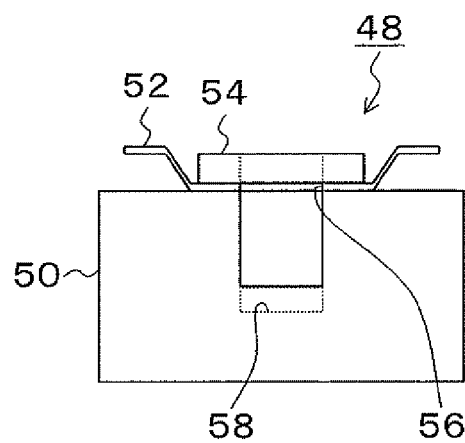
FIGS. 18A and 18B are explanatory drawings of a shape changing process according to the present art of changing the screw fastening unit circular arcs of a three-dimensional model to hexagonal shapes.
Figure 18B:
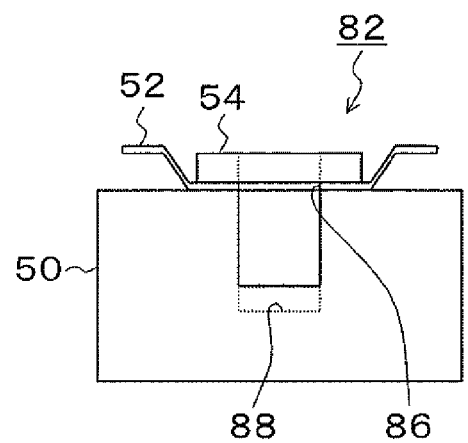

FIGS. 18A and 18B are explanatory drawings of a shape changing process according to the present art in which the circular arc of the screw fastening unit of a three-dimensional model is changed to a hexagonal shape. FIG. 18A shows the three-dimensional model 48 before shape change, and this is same as that of FIG. 4A. When the screw fastening unit of the three-dimensional model 48 is subjected to shape change of changing the circular arcs of the screw 54, the screw hole 58 and the screw through hole 56 to hexagonal shapes, a shape-changed model 82 of FIG. 18B is created.

In the shape-changed model 82, the screw hole 58 of the base 50 becomes a hexagonal screw hole 88, the screw through hole 56 of the cover 52 becomes a hexagonal screw through hole 86, and the head unit and the shaft unit of the screw 54 become a hexagonal head unit and a hexagonal shaft unit, respectively.

Figure 19A:
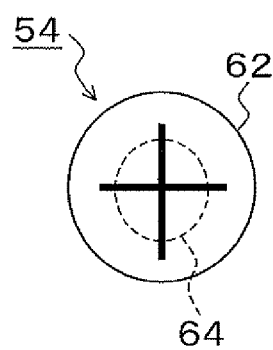
FIGS. 19A and 19B are explanatory drawings focusing on and showing the screw of FIGS. 18A and 18B.
Figure 19B:
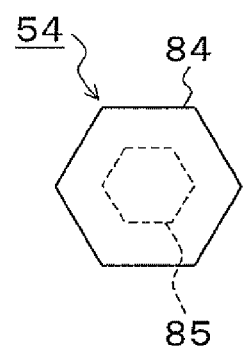

FIGS. 19A and 19B show the screw 54 of FIGS. 18A and 18B before change and after change, and the head unit 62 and the shaft unit 64 of the screw 54 of FIG. 19A before change are caused to be a hexagonal head unit 84 and a hexagonal shaft unit 85 as shown in FIG. 19B through the shape change.

Figure 20A:
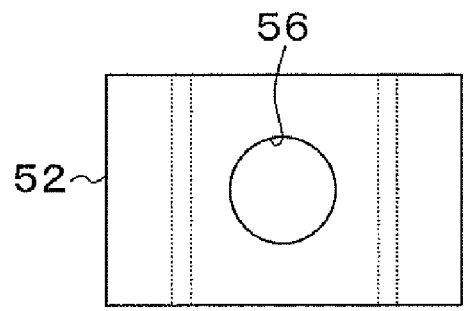
FIGS. 20A and 20B are explanatory drawings focusing on and showing the cover of FIGS. 18A and 18B.
Figure 20B:
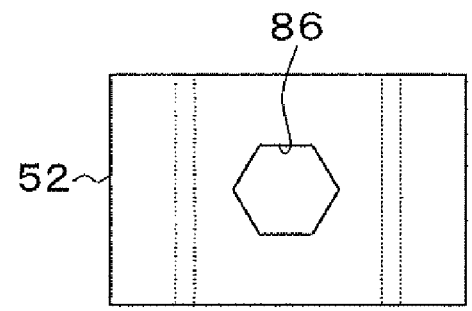

FIGS. 20A and 20B show the cover 52 of FIGS. 18A and 18B before change and after change, and the screw through hole 56 of the cover 52 of FIG. 20A before change is caused to be a hexagonal screw through hole 86 after change as shown in FIG. 20B.

Figure 21A:
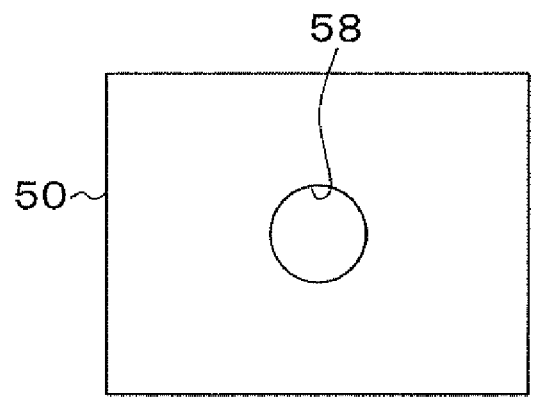
FIGS. 21A and 21B are explanatory drawings focusing on and showing the base of FIGS. 18A and 18B.
Figure 21B:
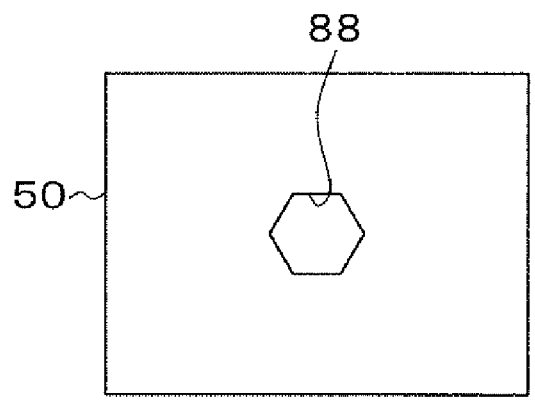

Furthermore, FIGS. 21A and 21B show the base 50 of FIGS. 18A and 18B before shape change and after shape change, and the screw hole 58 of FIG. 21A before change is caused to be a hexagonal screw hole 88 after change as shown in FIG. 21B.

With respect to the hexagonal head unit 84 and the hexagonal shaft unit 85 of the screw 54, the hexagonal screw through hole 86 of the cover 52, and the hexagonal screw hole 88 of the base 50 of the shape-changed model 82 show in FIGS. 18A and 18B to FIGS. 21A and 21B, as well as the case shown in FIGS. 12A to 12C, FIGS. 14A and 14B, or FIGS. 16A and 16B, mesh creation using triangular meshes or trapezoidal meshes is performed by using, for example, library data for hexagonal meshes prepared in the mesh data library 26.

Also in this case, the meshes are allocated along the hexagonal outer peripheral edge surface for the screw 54 and the hexagonal inner peripheral edge surface for the screw hole, mesh creation of the screw, screw through hole, and screw hole which have precisely shape-changed to hexagons can be performed without causing the meshes to be projected or, reversely recessed from each edge surface, and an engagement state in the screw fastening unit can be precisely realized.

Figure 22:
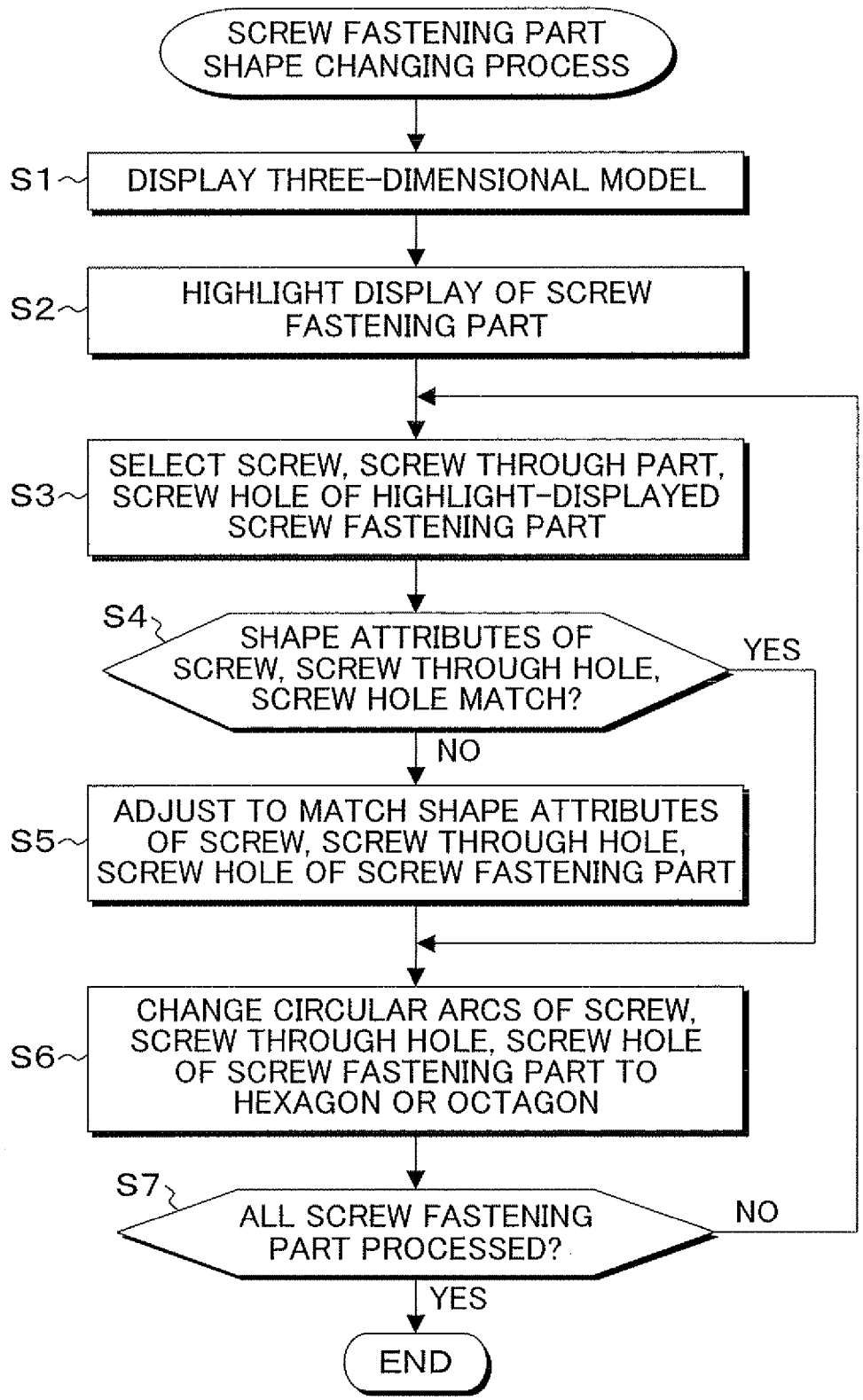
FIG. 22 is a flow chart of a screw fastening unit shape changing process according to the present art.

FIG. 22 is a flow chart of a screw fastening unit shape changing process by the screw fastening unit analysis model creation apparatus 10 of FIG. 1. In FIG. 22, first of all, in step S1, a three-dimensional model which is specified as a processing object by an operator is read from the three-dimensional model storage file 14 and displayed in a display. Subsequently, in step S2, a screw fastening unit in the displayed three-dimensional model is automatically searched, and highlight display of indicating the location is performed.

Subsequently, a screw, screw through hole, and screw hole of the highlight-displayed screw fastening unit are selected in step S3, and whether the shape characteristics of the screw, screw through hole, screw hole are matched is determined in step S4. As the shape characteristics, examination whether the outer diameter of the screw and the hole diameter of the screw hole are matched and examination whether the origin points and end points of the screw, screw through hole, and screw hole are matched is performed as described above. If the shape characteristics are unmatched in step S4, adjustment of matching the shape characteristics is executed in step S5.

Subsequently, in step S6, each of the circular arc parts of the screw, screw through hole, and screw hole of the screw fastening unit is changed into a hexagonal shape or an octagonal shape which is a change shape set in advance, thereby creating a shape-changed model. Subsequently, whether processing of all screw fastening units is finished is checked in step S7. If unfinished, the process returns to step S3 wherein similar processes are repeated for a next screw fastening unit; and, when processing of all the screw fastening units is finished in step S7, the series of shape changing process of the screw fastening units is finished.

Figure 23:
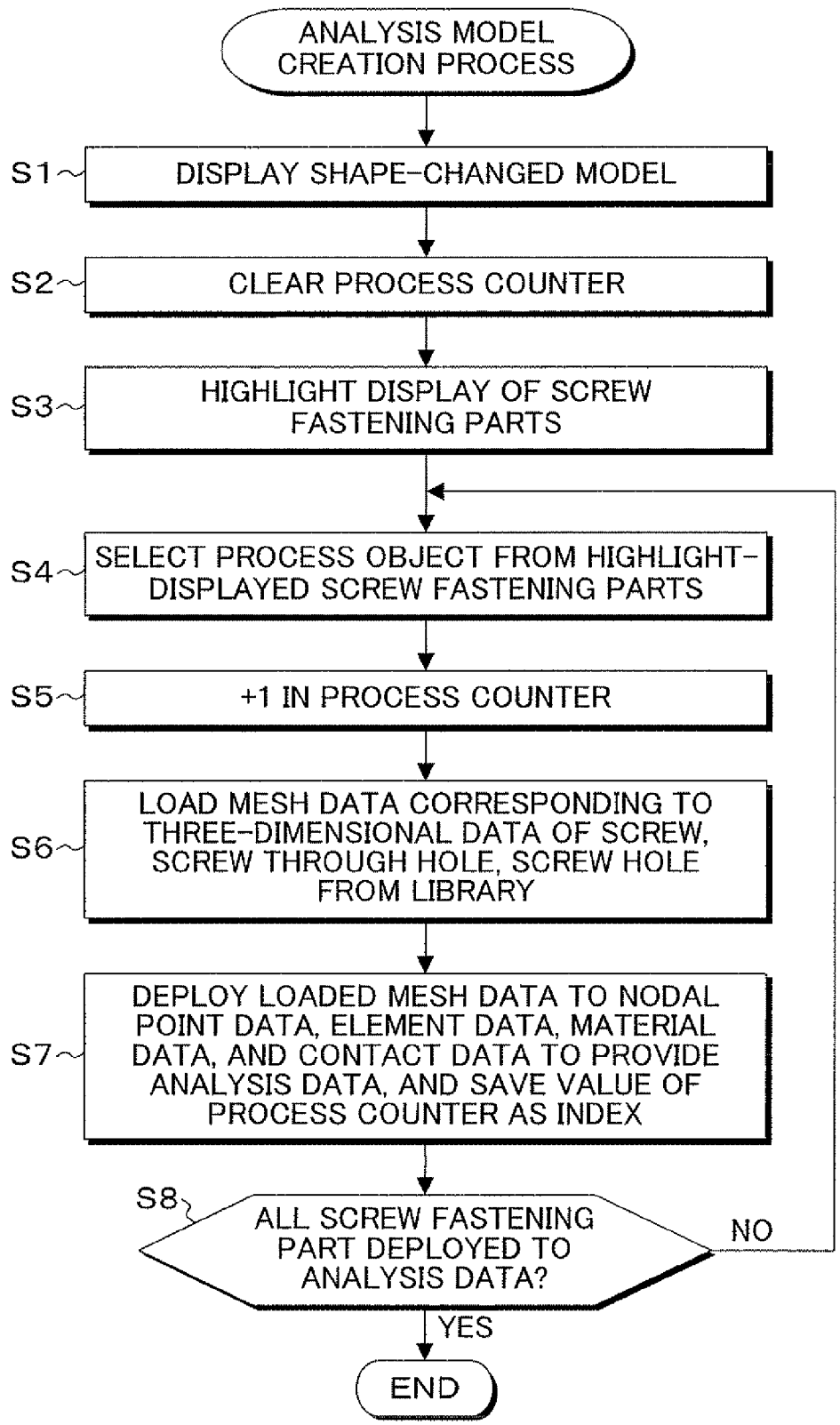
FIG. 23 is a flow chart of an analysis model creation process according to the present art.
Figure 24A:
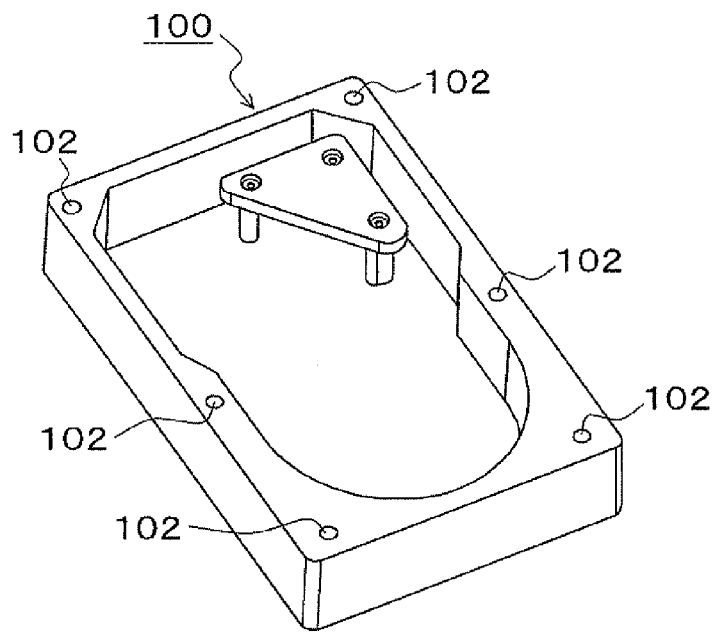
FIGS. 24A and 24B are an explanatory views of a three-dimensional model used in conventional misalignment analysis of a screw fastening unit.
Figure 24B:
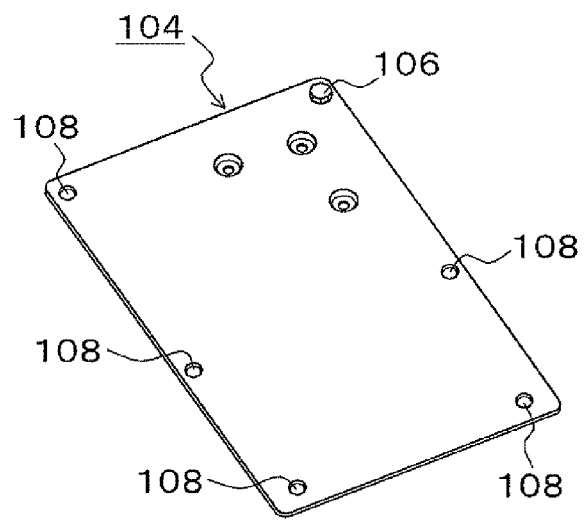
Figure 25:
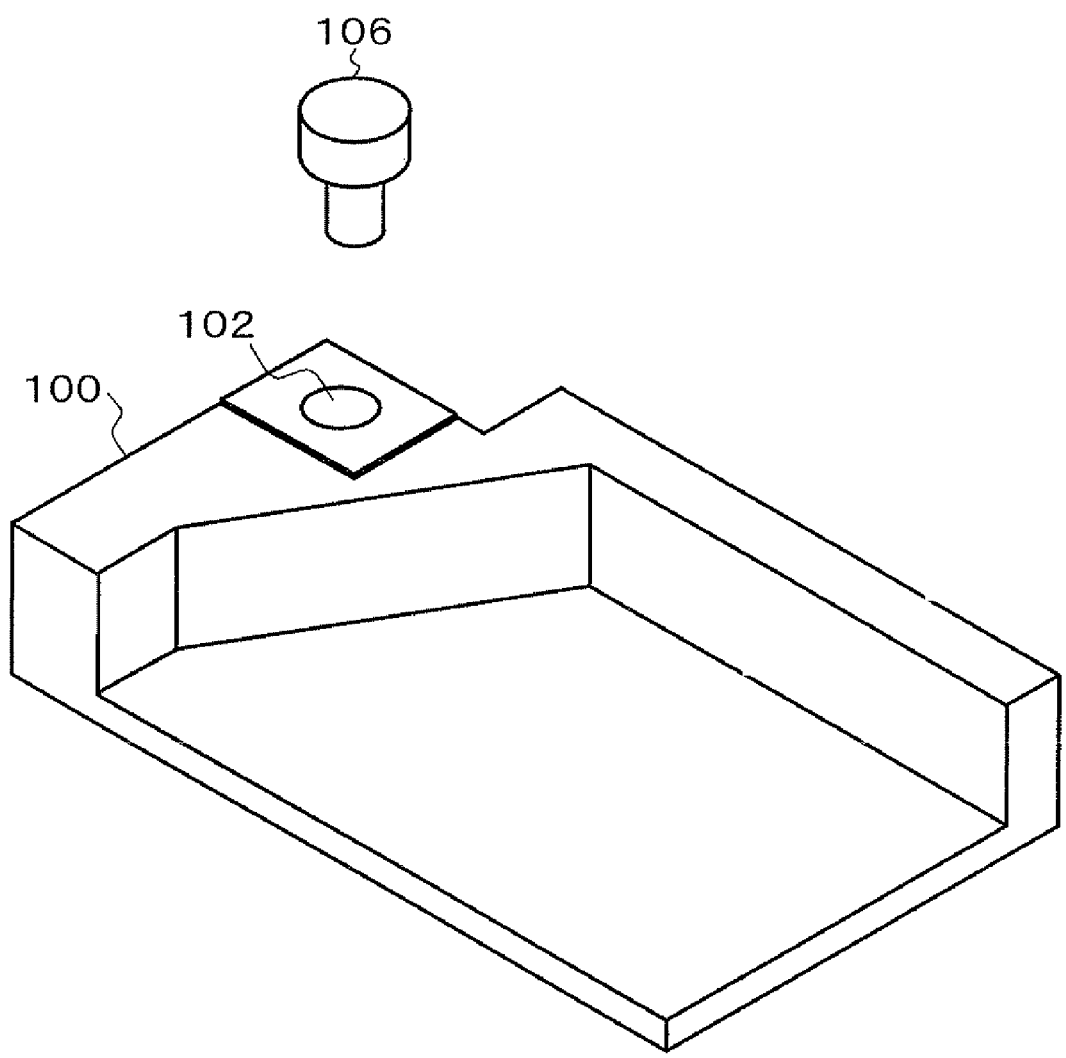
FIG. 25 is an explanatory view focuses on and shows the base of FIG. 1 which serves as an object of mesh separation.
Figure 26A:
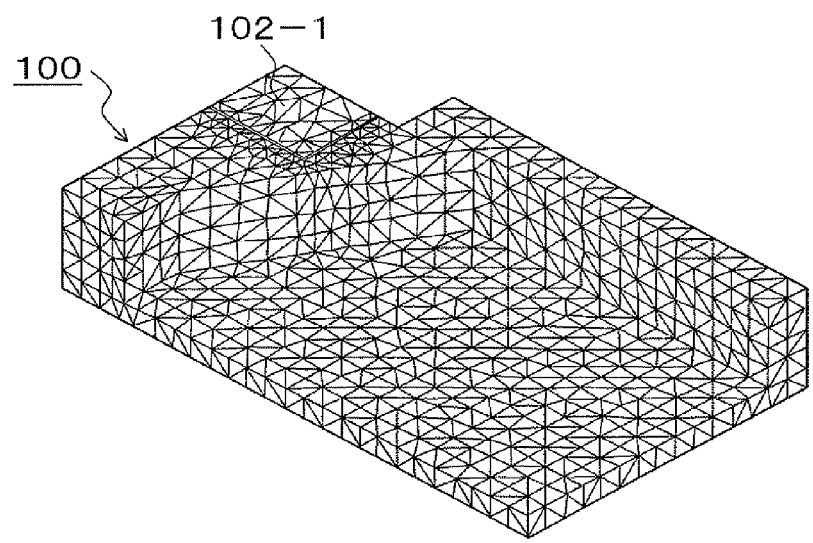
FIGS. 26A to 26C are explanatory views of an analysis model obtained by subjecting the base of FIG. 25 to mesh separation.
Figure 26B:
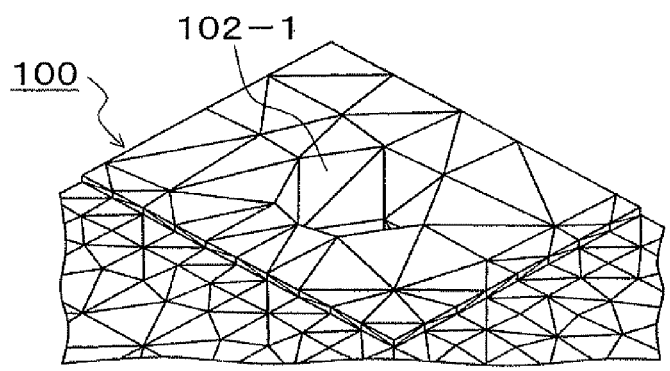
Figure 26C:
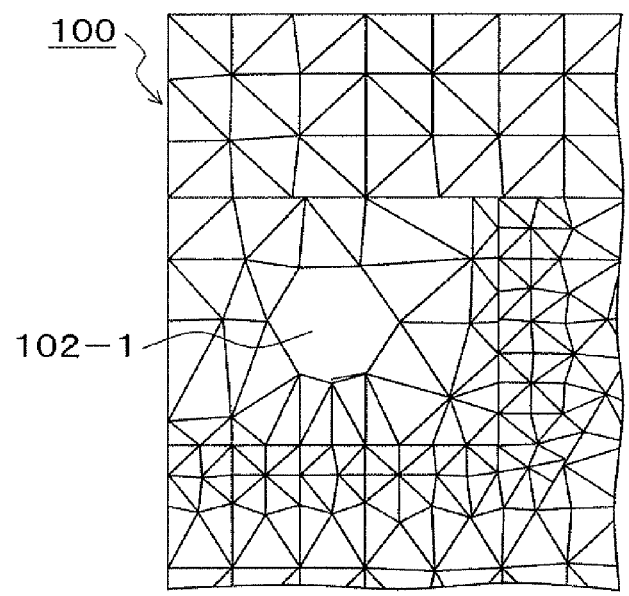
Figure 27A:
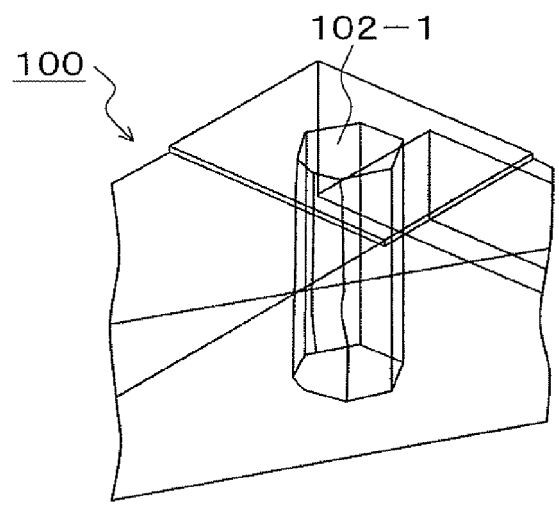
FIGS. 27A to 27C are explanatory views showing the edge shapes of FIGS. 26A to 26C with the meshes eliminated.
Figure 27B:
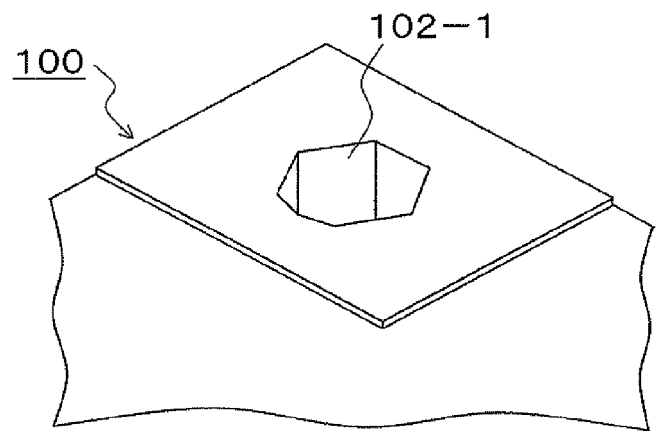
Figure 27C:
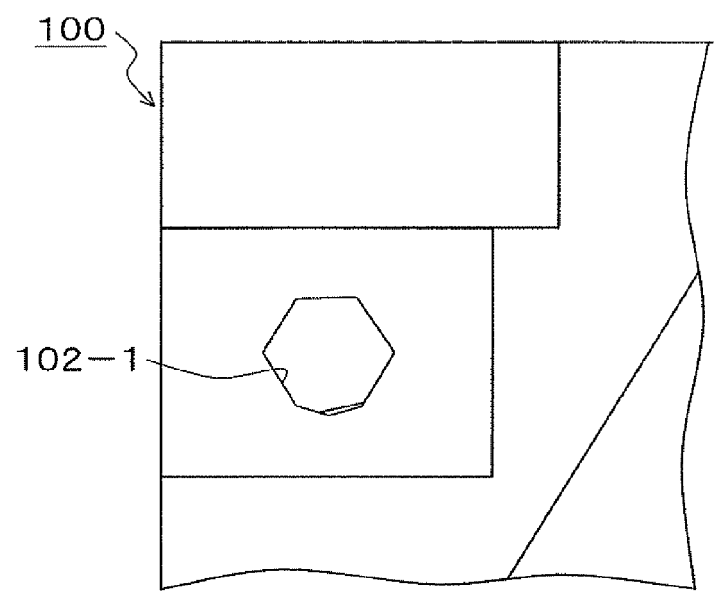
Figure 28A:
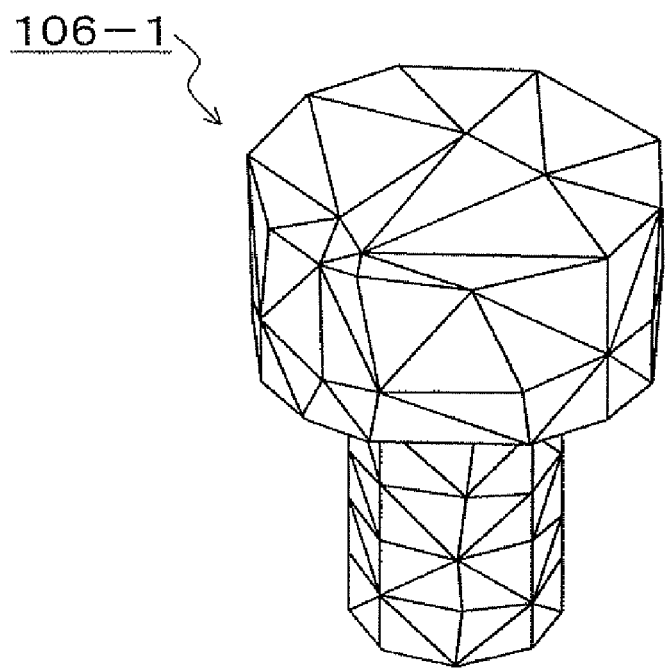
FIGS. 28A and 28B are explanatory views of an analysis model obtained by subjecting the screw of FIG. 25 to mesh separation.
Figure 28B:
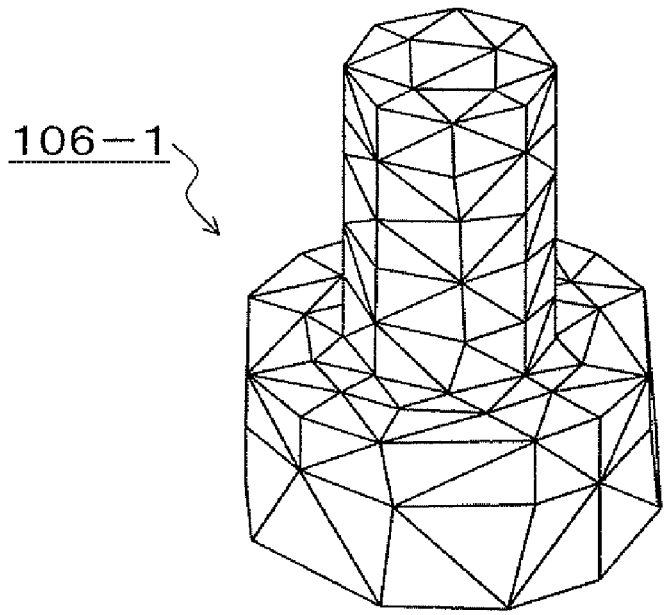
Figure 29A:
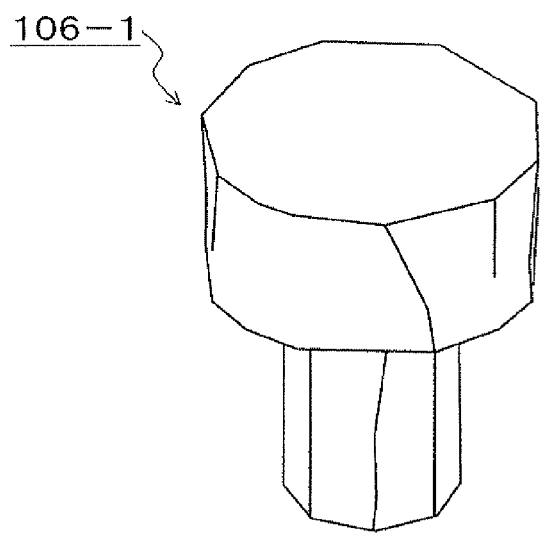
FIGS. 29A to 29C are explanatory views showing the edge shapes of FIGS. 28A and 28b with the meshes eliminated.
Figure 29B:
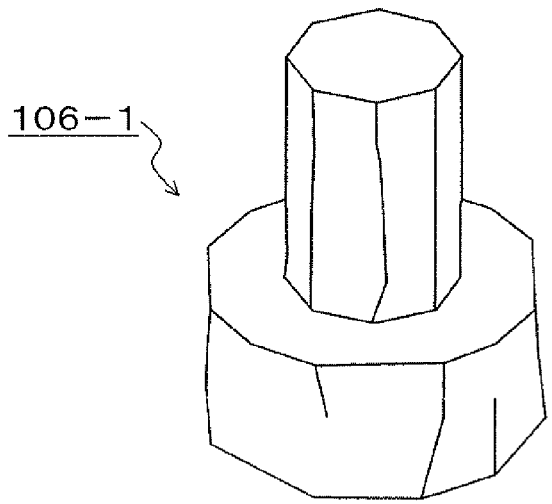
Figure 29C:
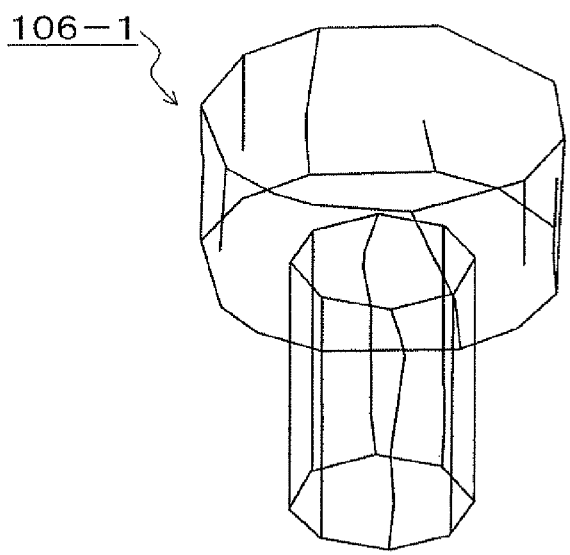
Figure 30A:
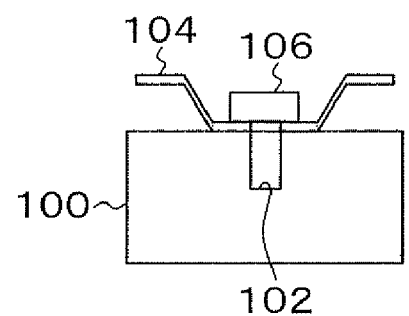
FIGS. 30A and 30B are explanatory views of an analysis model used in misalignment analysis between members without performing mesh separation.
Figure 30B:
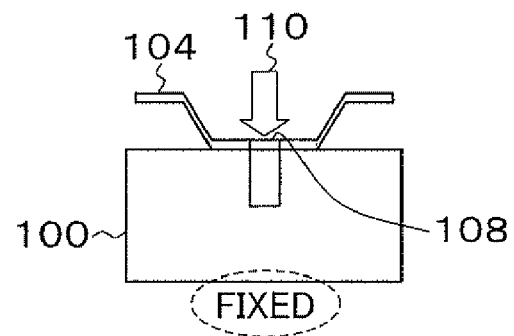
Figure 31:
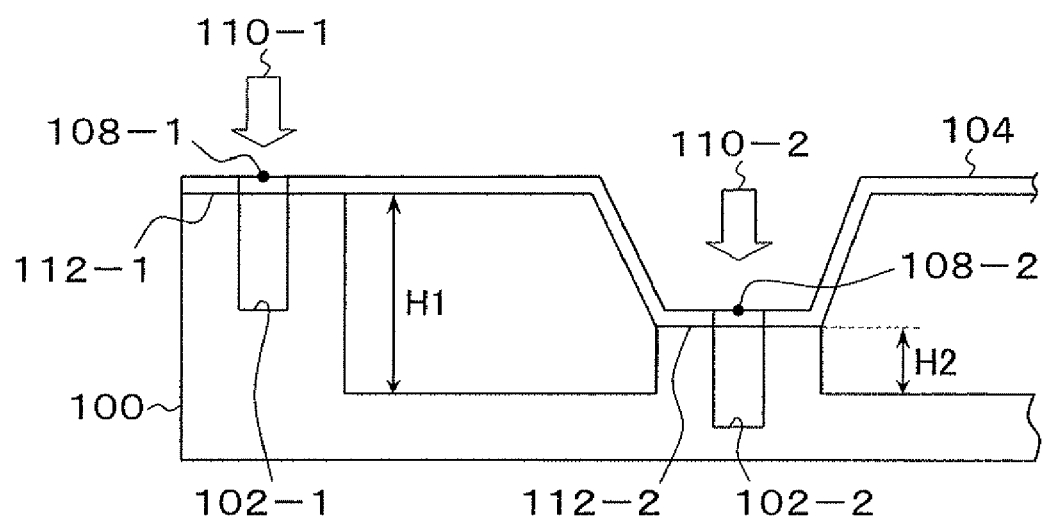
FIG. 31 is an explanatory view of an analysis model having a level difference in a screw fastening unit.

FIG. 23 is a flow chart of an analysis model creation process in the screw fastening unit analysis model creation apparatus 10 of FIG. 1. In FIG. 23, in the analysis model creation process, shape-changed models created in the shape changing process of FIG. 22 are displayed in the display, subsequently, the screw processing counter is cleared in step S2, the screw fastening units are then highlight-displayed in step S3, and the screw fastening unit which serves as a processing object is selected from among the highlight-displayed screw fastening units in step S4.

Subsequently, counting up by one is performed in the screw processing counter in step S5, and the mesh data corresponding to the selected screw fastening unit is loaded from the mesh data library 26 in step S6. The mesh data loaded from the library is in three types, that is, that of the screw, screw through hole, and screw hole.

Subsequently, in step S7, the loaded mesh data is deployed into nodal point data, element data, material data, and contact data to provide analysis data, and mesh creation can be performed by saving the value of the screw processing counter at this point as an index.

Subsequently, whether all the screw fastening units are deployed into analysis data is checked in step S8. If they are unprocessed, the process returns to step S4, and similar processes are repeated. When deployment of analysis data is finished for all the screw fastening units in step S8, the series of processes is finished. As a result, analysis models which have undergone mesh creation can be created, and misalignment analysis between the members can be performed by the analysis apparatus 18.

In the flow chart of FIG. 23, the corresponding mesh data is loaded and deployed from the library for the three elements, the screw, screw through hole, and screw hole constituting the screw fastening unit. However, when libraries of mesh data are created merely about screws as another embodiment, the automatic mesh creation by the analysis model processing of FIG. 23 is performed merely for the screws, and, regarding the mesh creation other than that, mesh creation is performed through dialogue operations by an operator.

When the libraries of the mesh data are created respectively for the screw through holes and screw holes, the mesh creation process may be repeated in the screw unit, screw through hole unit, and screw hole unit.

Moreover, the present art provides a program that realizes the screw fastening unit model creation process according to the present art executed by the computer of FIG. 3, and the program has the substances shown in the flow charts of FIG. 22 and FIG. 23.

Furthermore, the present art provides a computer-readable recording medium storing a program for screw fastening unit analysis model creation processing. Examples of the recording medium include portable-type storage media such as CD-ROMs, floppy disks (R), DVD disks, magneto-optical disks, and IC cards; storage apparatuses such as hard disks provided inside/outside a computer system; databases that retain programs via a line; another computer system and a database thereof; and online transmission media.

According to the present art, before performing mesh creation, circular arc edges of a screw, screw through hole, and screw hole in a three-dimensional model are changed to polygonal line segment edges.

As a result, triangular or trapezoidal meshes are allocated along the line segments. Therefore, overlapping or gaps are not generated between the screw shape, the screw through hole of the cover, and the screw hole of the base after mesh creation, and precise engagement can be performed.

Therefore, an analysis model in which the meshes of the screw fastening unit between the members in the three-dimensional model are precisely engaged can be created. As a result, strict analysis such as analysis of misalignment between the members caused by temperature variation wherein friction is taken into consideration and analysis of misalignment between the members caused by shock wherein friction is taken into consideration can be performed, thereby contributing to quality improvement of products.

Moreover, a library of mesh data of a unit size composed of a mesh aggregation realizing each shape is created for the hole shapes of the screw, the screw through hole and screw hole. As a result, upon mesh creation, mesh creation can be readily realized at a high speed merely by changing the scale thereof so that the mesh data made as the library is matched with the size of an applied model, and the time taken by creation of the analysis model from the three-dimensional model, which used to take for example about 50 houses, can be shortened by the present art to about 25 hours, which is about half.

Note that the present art includes arbitrary modifications that do not impair the object and advantages thereof, and the present art is not limited by the numerical values shown in the above described embodiments.

What is claimed is:

1. A screw fastening unit analysis model creation method including:
   a screw fastening unit extracting step of extracting a screw fastening unit, in which at least two or more members are fastened by a screw, from a three-dimensional model;
   a shape changing step of changing each of circular arc surfaces of the screw, a screw through hole, and a screw hole disposed in the screw fastening unit to a polygonal polyhedron approximating the circular arc surface;
   a mesh creation step of creating an analysis model which is divided into a meshed analysis unit by allocation of polyhedral meshes along each of the edge surfaces of the screw, screw through hole, and screw hole which is changed to polyhedrons; and
   a contact definition step of setting the friction of a contact unit of the mesh-divided screw and screw hole to be infinite so as to achieve a fixed state;
   wherein, in the mesh creation step, mesh data of a unit size composed of a mesh aggregation allocated to each of the polyhedral screw outer shape and hole shapes of the screw through hole and the screw hole after the shape change is prepared in advance, the scale of the mesh data is changed so that the data is matched with the size of the screw, screw through hole, and screw hole, and the mesh aggregations are allocated,
   wherein the mesh data of the unit size is composed of element data indicating the numbers of elements of the mesh aggregation, nodal point data indicating the total number of connecting vertices of the elements, material data indicating the material of the element, and contact data defining the elements in contact.

2. The screw fastening unit analysis model creation method according to claim 1, wherein, in the shape changing step, the circular arc surfaces of the screw, screw through hole, and screw hole are changed to hexagonal or octagonal polyhedrons.

3. The screw fastening unit analysis model creation method according to claim 1, wherein one of the members of the three-dimensional model is a housing case of a device, and the other member is a cover fixed to the housing case by screw fastening.

4. The screw fastening unit analysis model creation method according to claim 1, wherein, in the shape changing step, whether shape attributes of the screw, screw through hole, and screw hole are matched is examined, and, if unmatched, the shape change is performed after matching the shape attributes.

5. The screw fastening unit analysis model creation method according to claim 4, wherein, in the shape changing step, as the shape attributes of the screw, screw through hole, and screw hole, whether the outer diameter of the screw and the hole diameter of the screw hole are matched and whether the origin points and end points of edge shapes of the screw, screw through hole, and screw hole are matched is examined; and, if unmatched, the shape change is performed after they are caused to be matched.

6. A non-transitory computer-readable storage medium storing a program to cause a computer to operate as a screw fastening unit analysis model creation apparatus and execute operations, the operations comprising:
   a screw fastening unit extracting step of extracting a screw fastening unit, in which at least two or more members are fastened by a screw, from a three-dimensional model;
   a shape changing step of changing each of circular arc surfaces of the screw, a screw through hole, and a screw hole disposed in the screw fastening unit to a polygonal polyhedron approximating the circular arc surface;
   a mesh creation step of creating an analysis model which is divided into a meshed analysis unit by allocation of polyhedral meshes along each of the edge surfaces of the screw, screw through hole, and screw hole which is changed to polyhedrons; and
   a contact definition step of setting the friction of a contact unit of the mesh-divided screw and screw hole to be infinite so as to achieve a fixed state;
   wherein, in the mesh creation step, mesh data of a unit size composed of a mesh aggregation allocated to each of the polyhedral screw outer shape and hole shapes of the screw through hole and the screw hole after the shape change is prepared in advance, the scale of the mesh data is changed so that the data is matched with the size of the screw, screw through hole, and screw hole, and the mesh aggregations are allocated
   wherein the mesh data of the unit size is composed of element data indicating the numbers of elements of the mesh aggregation, nodal point data indicating the total number of connecting vertices of the elements, material data indicating the material of the element, and contact data defining the elements in contact.

7. A non-transitory computer-readable storage medium according to claim 6, wherein, in the shape changing step, the circular arc surfaces of the screw, screw through hole, and screw hole are changed to hexagonal or octagonal polyhedrons.

8. A non-transitory computer-readable storage medium according to claim 6, wherein one of the members of the three-dimensional model is a housing case of a device, and the other member is a cover fixed to the housing case by screw fastening.

9. A non-transitory computer readable storage medium according to claim 6, wherein, in the shape changing step, whether shape attributes of the screw, screw through hole, and screw hole are matched is examined, and, if unmatched, the shape change is performed after matching the shape attributes.

10. A non-transitory computer readable storage medium according to claim 9, wherein, in the shape changing step, as the shape attributes of the screw, screw through hole, and screw hole, whether the outer diameter of the screw and the hole diameter of the screw hole are matched and whether the origin points and end points of edge shapes of the screw, screw through hole, and screw hole are matched is examined; and, if unmatched, the shape change is performed after they are caused to be matched.

11. A screw fastening unit analysis model creation apparatus having:

a screw fastening unit extracting device to extract a screw fastening unit, in which at least two or more members are fastened by a screw, from a three-dimensional model;

a shape changing device to change each of circular arc surfaces of the screw, a screw through hole, and a screw hole disposed in the screw fastening unit to a polygonal polyhedron approximating the circular arc surface;

a mesh creation device to create an analysis model which is divided into a meshed analysis unit by allocation of polyhedral meshes along each of the edge surfaces of the screw, screw through hole, and screw hole which is changed to polyhedrons; and a contact definition device to set the friction of a contact unit of the mesh-divided screw and screw hole to be infinite so as to achieve a fixed state;

wherein the mesh separation-device prepares mesh data of a unit size composed of a mesh aggregation allocated to each of the polyhedral screw outer shape and hole shapes of the screw through hole and the screw hole after the shape change in advance, changes the scale of the mesh data so that the data is matched with the size of the screw, screw through hole, and screw hole, and allocates the mesh aggregations, wherein the mesh data of the unit size is composed of element data indicating the numbers of elements of the mesh aggregation, nodal point data indicating the total number of connecting vertices of the elements, material data indicating the material of the element, and contact data defining the elements in contact.

12. The screw fastening unit analysis model creation apparatus according to claim 11, wherein, the shape changing-device changes the circular arc surfaces of the screw, screw through hole, and screw hole to hexagonal or octagonal polyhedrons.

13. The screw fastening unit analysis model creation apparatus according to claim 11, wherein, the shape changing device examines whether shape attributes of the screw, screw through hole, and screw hole are matched, and, if unmatched, the shape change is performed after matching the shape attributes.

14. The screw fastening unit analysis model creation apparatus according to claim 13, wherein the shape changing unit examines, as the shape attributes of the screw, screw through hole, and screw hole, whether the outer diameter of the screw and the hole diameter of the screw hole are matched and whether the origin points and end points of edge shapes of the hole of the screw, screw through hole, and screw hole are matched; and, if unmatched, the shape change is performed after they are caused to be matched.

* * * * *